United States Patent
Yang et al.

(10) Patent No.: US 11,721,697 B2
(45) Date of Patent: *Aug. 8, 2023

(54) MANUFACTURING METHOD OF SEMICONDUCTOR DEVICE

(71) Applicant: UNITED MICROELECTRONICS CORP., Hsin-Chu (TW)

(72) Inventors: Po-Yu Yang, Hsinchu (TW); Yu-Wen Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/735,114

(22) Filed: May 3, 2022

(65) Prior Publication Data

US 2022/0271032 A1 Aug. 25, 2022

Related U.S. Application Data

(63) Continuation of application No. 17/163,586, filed on Feb. 1, 2021, now Pat. No. 11,355,494.

(30) Foreign Application Priority Data

Jan. 11, 2021 (CN) .......................... 202110031069.0

(51) Int. Cl.
*H01L 27/092* (2006.01)
*H01L 29/10* (2006.01)
*H01L 29/08* (2006.01)
*H01L 29/06* (2006.01)
*H01L 29/423* (2006.01)

(52) U.S. Cl.
CPC ........ *H01L 27/092* (2013.01); *H01L 29/0665* (2013.01); *H01L 29/0847* (2013.01); *H01L 29/1033* (2013.01); *H01L 29/42356* (2013.01)

(58) Field of Classification Search
CPC ............... H01L 27/092; H01L 29/0673; H01L 29/0665; H01L 29/42392; H01L 29/78696; H01L 27/0688; H01L 21/8221; H01L 21/823807; H01L 29/1033; H01L 29/0847
See application file for complete search history.

(56) References Cited

U.S. PATENT DOCUMENTS 9,806,203 B2 10/2017 Then
11,355,494 B1* 6/2022 Yang .................. H01L 29/0847
(Continued)

*Primary Examiner* — Changhyun Yi
(74) *Attorney, Agent, or Firm* — Winston Hsu

(57) ABSTRACT

A manufacturing method of a semiconductor device is provided in an embodiment of the present invention. The manufacturing method includes the following steps. A transistor is formed on a substrate. The transistor includes a plurality of semiconductor sheets and two source/drain structures. The semiconductor sheets are stacked in a vertical direction and separated from one another. Each of the semiconductor sheets includes two first doped layers and a second doped layer disposed between the two first doped layers in the vertical direction. A conductivity type of the second doped layer is complementary to a conductivity type of each of the two first doped layers. The two source/drain structures are disposed at two opposite sides of each of the semiconductor sheets in a horizontal direction respectively, and the two source/drain structures are connected with the semiconductor sheets.

20 Claims, 19 Drawing Sheets

(56) References Cited

U.S. PATENT DOCUMENTS

2014/0151639 A1 6/2014 Chang
2020/0266060 A1 8/2020 Cheng
2021/0349691 A1 11/2021 Hekmatshoartabari

* cited by examiner

MANUFACTURING METHOD OF SEMICONDUCTOR DEVICE

CROSS REFERENCE TO RELATED APPLICATIONS

This application is a continuation application of U.S. application Ser. No. 17/163,586, filed on Feb. 1, 2021. The content of the application is incorporated herein by reference.

BACKGROUND OF THE INVENTION

1. Field of the Invention

The present invention relates to a manufacturing method of a semiconductor device, and more particularly, to a manufacturing method of a semiconductor device including semiconductor sheets.

2. Description of the Prior Art

The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor. For example, dual-gate fin field effect transistor (FinFET) device, tri-gate FinFET device, and omega-FinFET device have been provided. Furthermore, gate-all-around (GAA) nanowire FET device is progressed for achieving the ongoing goals of high performance, increased miniaturization of integrated circuit components, and greater packaging density of integrated circuits. However, under the concept of the GAA, how to further enhance device characteristics (such as electrical performance) through process and/or structural design is still the direction of continuous efforts by people in related fields.

SUMMARY OF THE INVENTION

It is one of the objectives of the present invention to provide a manufacturing method of a semiconductor device. A second doped layer is sandwiched between two first doped layers having a conductivity type different from that of the second doped layer for forming a semiconductor sheet, and the electrical performance of the semiconductor device may be enhanced accordingly.

A manufacturing method of a semiconductor device is provided in an embodiment of the present invention. The manufacturing method includes the following steps. A transistor is formed on a substrate. The transistor includes a plurality of semiconductor sheets and two source/drain structures. The semiconductor sheets are stacked in a vertical direction and separated from one another. Each of the semiconductor sheets includes two first doped layers and a second doped layer disposed between the two first doped layers in the vertical direction. A conductivity type of the second doped layer is complementary to a conductivity type of each of the two first doped layers. The two source/drain structures are disposed at two opposite sides of each of the semiconductor sheets in a horizontal direction respectively, and the two source/drain structures are connected with the semiconductor sheets.

A manufacturing method of a semiconductor device is provided in another embodiment of the present invention. The manufacturing method includes the following steps. A first transistor is formed on a substrate, and a second transistor is formed on the substrate. The first transistor includes a plurality of first semiconductor sheets and two first source/drain structures. The first semiconductor sheets are stacked in a vertical direction and separated from one another. Each of the first semiconductor sheets includes two first doped layers and a second doped layer disposed between the two first doped layers in the vertical direction. A conductivity type of the second doped layer is complementary to a conductivity type of each of the two first doped layers. The two first source/drain structures are disposed at two opposite sides of each of the first semiconductor sheets in a horizontal direction respectively, and the first source/drain structures are connected with the first semiconductor sheets. The second transistor includes a plurality of second semiconductor sheets and two second source/drain structures. The second semiconductor sheets are stacked in the vertical direction and separated from one another. Each of the second semiconductor sheets includes two third doped layers and a fourth doped layer disposed between the two third doped layers in the vertical direction. A conductivity type of the fourth doped layer is complementary to a conductivity type of each of the two third doped layers, and the conductivity type of each of the two third doped layers is identical to the conductivity type of each of the first doped layers. The two second source/drain structures are disposed at two opposite sides of each of the second semiconductor sheets in the horizontal direction respectively, and the second source/drain structures are connected with the second semiconductor sheets.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 7-15 are schematic drawings illustrating a manufacturing method of the semiconductor device according to the first embodiment of the present invention, wherein FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, and FIG. 15 is a schematic drawing in a step subsequent to FIG. 14.

FIGS. 17-22 are schematic drawings illustrating a manufacturing method of the semiconductor device according to the second embodiment of the present invention, wherein FIG. 18 is a schematic drawing in a step subsequent to FIG. 17, FIG. 19 is a schematic drawing in a step subsequent to FIG. 18, FIG. 20 is a schematic drawing in a step subsequent to FIG. 19, FIG. 21 is a schematic drawing in a step subsequent to FIG. 20, and FIG. 22 is a schematic drawing in a step subsequent to FIG. 21.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
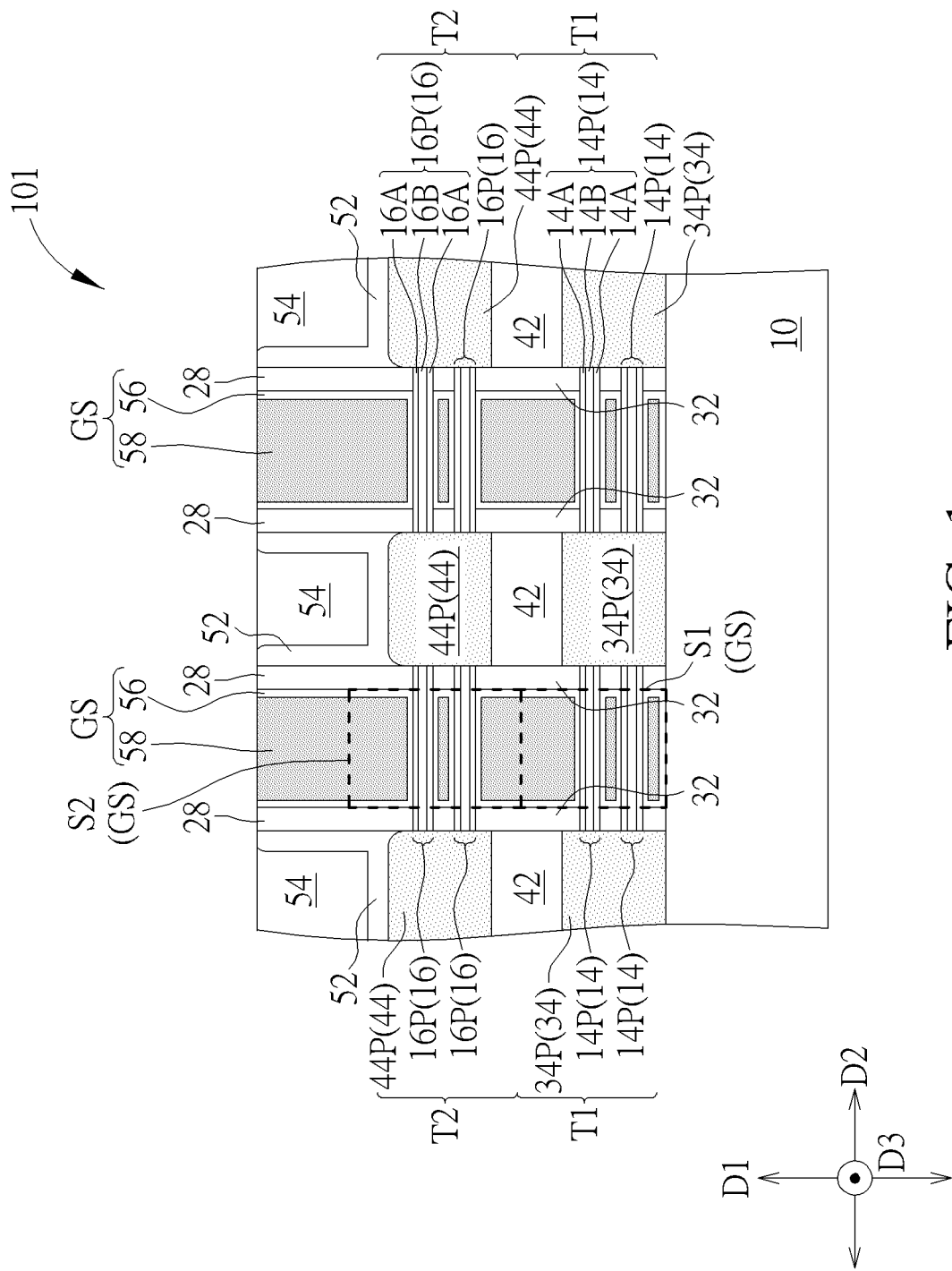
FIG. 1 is a schematic drawing illustrating a semiconductor device according to a first embodiment of the present invention.
Figure 2:
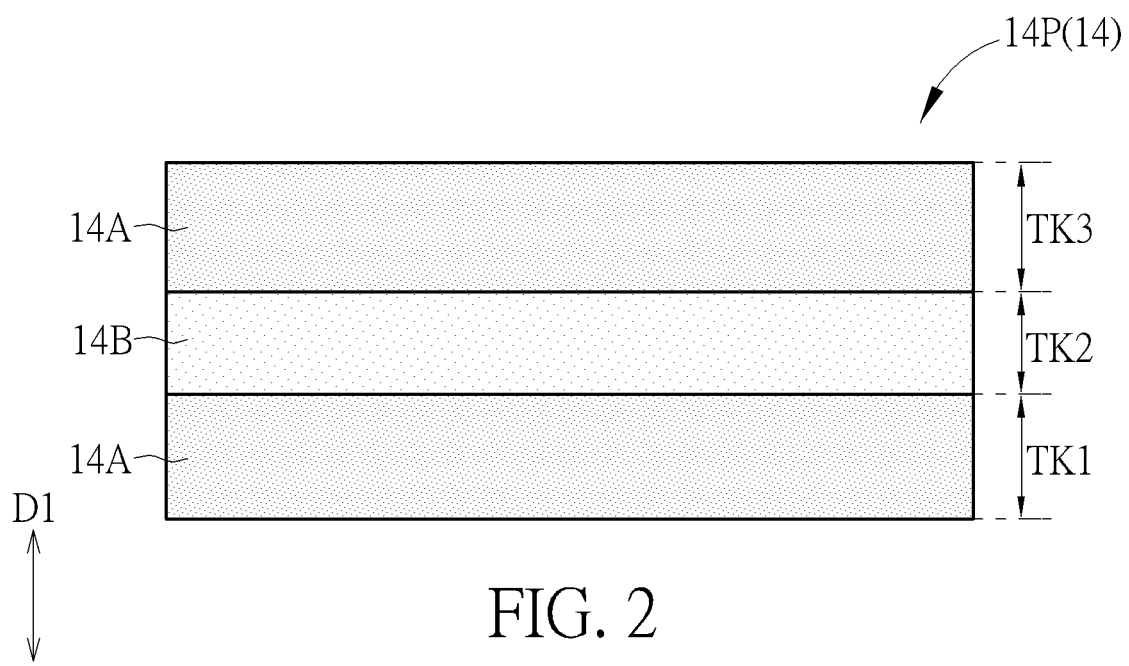
FIG. 2 is a schematic drawing illustrating a first semiconductor sheet according to the first embodiment of the present invention.
Figure 3:
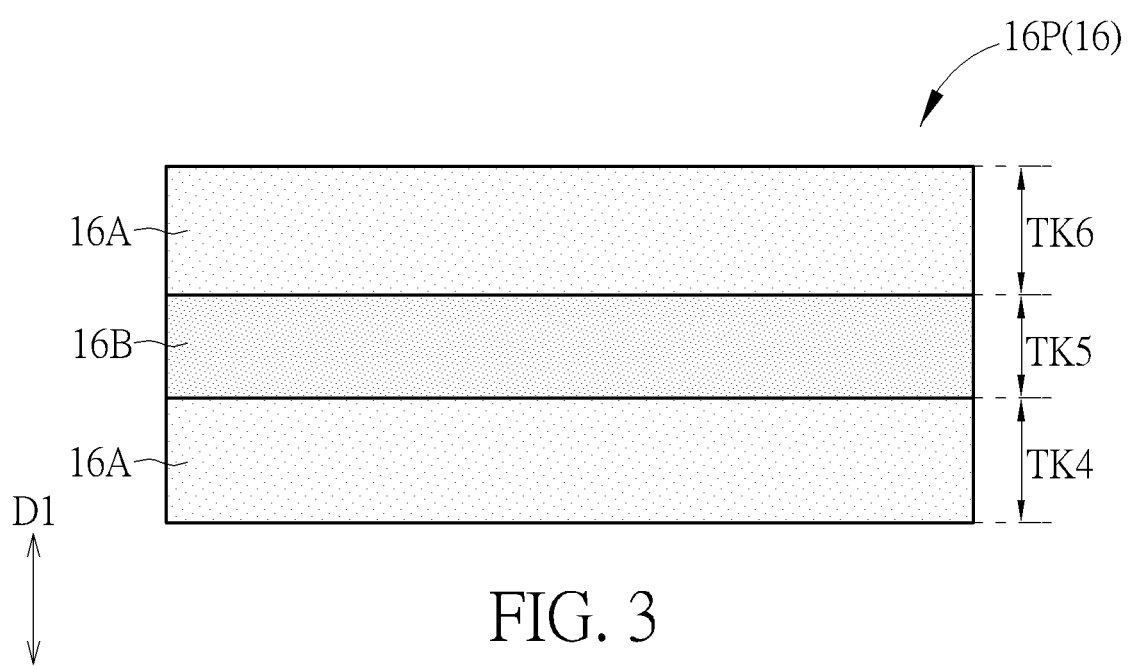
FIG. 3 is a schematic drawing illustrating a second semiconductor sheet according to the first embodiment of the present invention.

Please refer to FIG. 1, FIG. 2, and FIG. 3. FIG. 1 is a schematic drawing illustrating a semiconductor device according to a first embodiment of the present invention, FIG. 2 is a schematic drawing illustrating a first semiconductor sheet in this embodiment, and FIG. 3 is a schematic drawing illustrating a second semiconductor sheet in this embodiment. As shown in FIGS. 1-3, a semiconductor device 101 includes a substrate 10 and a first transistor T1 disposed on the substrate 10. The first transistor T1 includes a plurality of first semiconductor sheets 14P and two first source/drain structures 34P. The first semiconductor sheets 14P are stacked in a vertical direction (such as a first direction D1 shown in FIG. 1) and separated from one another. Each of the first semiconductor sheets 14P includes two first doped layers 14A and a second doped layer 14B disposed between the two first doped layers 14A in the first direction D1. A conductivity type of the second doped layer 14B is complementary to a conductivity type of each of the two first doped layers 14A. The two first source/drain structures 34P are disposed at two opposite sides of each of the first semiconductor sheets 14P in a horizontal direction (such as a second direction D2 shown in FIG. 1) respectively, and the two first source/drain structures 34P are connected with the first semiconductor sheets 14P.

In some embodiments, the first direction D1 described above may be regarded as a thickness direction of the substrate 10, and the substrate 10 may have a top surface and a bottom surface opposite to the top surface in the first direction D1. The first transistor T1 may be disposed at a side of the top surface of the substrate 10, but not limited thereto. In addition, horizontal directions (such as the second direction D2 and a third direction D3 shown in FIG. 1) substantially orthogonal to the first direction D1 may be substantially parallel with the top surface and/or the bottom surface of the substrate 10, but not limited thereto. Additionally, in this description, a distance between the substrate 10 and a relatively higher location and/or a relatively higher part in the first direction D1 is greater than a distance between the substrate 10 and a relatively lower location and/or a relatively lower part in the first direction D1. The bottom or a lower portion of each component may be closer to the substrate 10 in the first direction D1 than the top or upper portion of this component. Another component disposed above a specific component may be regarded as being relatively far from the substrate 10 in the first direction D1, and another component disposed under a specific component may be regarded as being relatively closer to the substrate 10 in the first direction D1.

At least a portion of each of the first semiconductor sheets 14P may be regarded as a channel region in the first transistor T1, and each of the first source/drain structures 34P may directly contact and be directly connected with the two first doped layers 14A and the second doped layer 14B in each of the first semiconductor sheets 14P. In some embodiments, a thickness of each of the first semiconductor sheets 14P may range from 5 nanometers to 100 nanometers, each of the first semiconductor sheets 14P may be regarded as a nanosheet, and the first transistor T1 may be regarded as a nanosheet transistor, but not limited thereto. Each of the first semiconductor sheets 14P may be composed of two first doped layers 14A and the second doped layer 14B sandwiched between the two first doped layers 14A in the first direction D1. In each of the first semiconductor sheets 14P, the second doped layer 14B may directly contact and be directly connected with the two first doped layers 14A in the first direction D1, and the conductivity type of the second doped layer 14B may be complementary to the conductivity type of the first doped layer 14A.

For example, when the first transistor T1 is an n-type transistor, each of the first doped layers 14A may be an n-type doped semiconductor layer having n-type conductivity, and each of the second doped layers 14B may be a p-type doped semiconductor layer having p-type conductivity. Comparatively, when the first transistor T1 is a p-type transistor, each of the first doped layers 14A may be a p-type doped semiconductor layer having p-type conductivity, and each of the second doped layers 14B may be an n-type doped semiconductor layer having n-type conductivity. The p-type doped semiconductor layer described above may include p-type impurities, such as boron or other suitable elements with characteristics of p-type conductivity, and the n-type doped semiconductor layer described above may include n-type impurities, such as phosphorus, arsenic, or other suitable elements with characteristics of n-type conductivity. In some embodiments, a thickness of each of the second doped layers 14B (such as a thickness TK2 shown in FIG. 2) may be less than or equal to a thickness of each of the first doped layers 14A (such as a thickness TK1 and/or a thickness TK3 shown in FIG. 2), but not limited thereto. For example, in each of the first semiconductor sheets 14P, the thickness TK2 of the second doped layer 14B may range from 2.5 nanometers to 5 nanometers, the thickness TK1 of the first doped layer 14A located under the second doped layer 14B and the thickness TK3 of the first doped layer 14A located above the second doped layer 14B may range from 5 nanometers to 10 nanometers respectively, and the thickness TK1 of the first doped layer 14A located under the second doped layer 14B may be substantially equal to the thickness TK3 of the first doped layer 14A located above the second doped layer 14B, but not limited thereto. In some embodiments, the thickness of each doped layer described above may also be regarded as the length of each doped layer in the first direction D1. In addition, an impurity concentration of each of the second doped layers 14B may be lower than an impurity concentration of each of the first doped layers 14A. For example, the impurity concentration of each of the first doped layers 14A may range from 1E+19 atoms/cm$^3$ to 1E+20 atoms/cm$^3$, and the impurity concentration of each of the second doped layers 14B may range from 1E+17 atoms/cm$^3$ to 1E+18 atoms/cm$^3$, but not limited thereto.

In some embodiments, a conductivity type of each of the two first source/drain structures 34P may be identical to the conductivity type of each of the first doped layers 14A, each of the first doped layers 14A and the two first source/drain structures 34P directly connected with the first doped layer 14A may form a junctionless structure in the first transistor T1 accordingly, and the first transistor T1 may be regarded as a junctionless transistor, but not limited thereto. Additionally, in some embodiments, each of the first source/drain structures 34P may include impurities, a conductivity type of the impurities in each of the first source/drain structures 34P may be identical to the conductivity type of the impurities in each of the first doped layers 14A, and an impurity concentration of each of the two first source/drain structures 34P may be substantially equal to an impurity concentration of each of the first doped layers 14A with a tolerance of ±10%, but not limited thereto. In other words, the impurity concentration of each of the two first source/drain structures 34P may be preferably equal to the impurity concentration of each of the first doped layers 14A. However, considering the feasible process variation control, the impurity concentration of each of the two first source/drain structures 34P may range from 90% of the impurity concentration of each of the first doped layers 14A to 110% of the impurity concentration of each of the first doped layers 14A, and the impurity concentration within this range can still reduce the negative influence of the impurity concentration variation between the first source/drain structure 34P and the first doped layer 14A on the operation of the first transistor T1, but not limited thereto.

In some embodiments, the semiconductor device 101 may further include a second transistor T2 disposed on the substrate 10, and the second transistor T2 includes a plurality of second semiconductor sheets 16P and two second source/drain structures 44P. The second semiconductor sheets 16P may be stacked in the first direction D1 and separated from one another, and each of the second semiconductor sheets 16P may include two third doped layers 16A and a fourth doped layer 16B disposed between the two third doped layers 16A in the first direction D1. The two second source/drain structures 44P may be disposed at two opposite sides of each of the second semiconductor sheets 16P in the second direction D2 respectively, and the second source/drain structures 44P may be connected with the second semiconductor sheets 16P. In some embodiments, a conductivity type of the fourth doped layer 16B may be complementary to a conductivity type of each of the two third doped layers 16A, and the conductivity type of the fourth doped layer 16B may be identical to the conductivity type of the first doped layer 14A, but not limited thereto. For example, when the first transistor T1 is an n-type transistor, the second transistor T2 may be a p-type transistor, each of the third doped layers 16A may be a p-type doped semiconductor layer having p-type conductivity, and each of the fourth doped layers 16B may be an n-type doped semiconductor layer having n-type conductivity. Comparatively, when the first transistor T1 is a p-type transistor, the second transistor T2 may be an n-type transistor, each of the third doped layers 16A may be an n-type doped semiconductor layer having n-type conductivity, and each of the fourth doped layers 16B may be a p-type doped semiconductor layer having p-type conductivity, but not limited thereto.

At least a portion of each of the second semiconductor sheets 16P may be regarded as a channel region in the second transistor T2, and each of the second source/drain structures 44P may directly contact and be directly connected with the two third doped layers 16A and the fourth doped layer 16B in each of the second semiconductor sheets 16P. In some embodiments, a thickness of each of the second semiconductor sheets 16P may range from 5 nanometers to 100 nanometers, but not limited thereto. Each of the second semiconductor sheets 16P may be composed of two third doped layers 16A and the fourth doped layer 16B sandwiched between the two third doped layers 16A in the first direction D1. In each of the second semiconductor sheets 16P, the fourth doped layer 16B may directly contact and be directly connected with the two third doped layers 16A in the first direction D1, and a thickness of each of the fourth doped layers 16B (such as a thickness TK5 shown in FIG. 3) may be less than or equal to a thickness of each of the third doped layers 16A (such as a thickness TK4 and/or a thickness TK6 shown in FIG. 3), but not limited thereto. For example, in each of the second semiconductor sheets 16P, the thickness TK5 of the fourth doped layer 16B may range from 2.5 nanometers to 5 nanometers, the thickness TK4 of the third doped layer 16A located under the fourth doped layer 16B and the thickness TK6 of the third doped layer 16A located above the fourth doped layer 16B may range from 5 nanometers to 10 nanometers respectively, and the thickness TK4 of the third doped layer 16A located under the fourth doped layer 16B may be substantially equal to the thickness TK6 of the third doped layer 16A located above the fourth doped layer 16B, but not limited thereto.

In some embodiments, an impurity concentration of each of the fourth doped layers 16B may be lower than an impurity concentration of each of the third doped layers 16A. For example, the impurity concentration of each of the third doped layers 16A may range from 1E+19 atoms/cm$^3$ to 1E+20 atoms/cm$^3$, and the impurity concentration of each of the fourth doped layers 16B may range from 1E+17 atoms/cm$^3$ to 1E+18 atoms/cm$^3$, but not limited thereto. In some embodiments, the conductivity type of each of the third doped layers 16A may be identical to the conductivity type of each of the second doped layers 14B, but the impurity concentration of each of the third doped layers 16A may be higher than the impurity concentration of each of the second doped layers 14B; and the conductivity type of each of the fourth doped layers 16B may be identical to the conductivity type of each of the first doped layers 14A, but the impurity concentration of each of the first doped layers 14A may be higher than the impurity concentration of each of the fourth doped layers 16B, but not limited thereto.

In some embodiments, a conductivity type of each of the second source/drain structures 44P may be identical to the conductivity type of each of the third doped layers 16A, each of the third doped layers 16A and the two second source/drain structures 44P directly connected with the third doped layer 16A may form a junctionless structure in the second transistor T2 accordingly, and the second transistor T2 may be regarded as a junctionless transistor also, but not limited thereto. Additionally, in some embodiments, each of the second source/drain structures 44P may include impurities, a conductivity type of the impurities in each of the second source/drain structures 44P may be identical to the conductivity type of the impurities in each of the third doped layers 16A, and an impurity concentration of each of the two second source/drain structures 44P may be substantially equal to an impurity concentration of each of the third doped layers 16A with a tolerance of ±10%, but not limited thereto. In other words, the impurity concentration of each of the two second source/drain structures 44P may be preferably equal to the impurity concentration of each of the third doped layers 16A. However, considering the feasible process variation control, the impurity concentration of each of the two second source/drain structures 44P may range from 90% of the impurity concentration of each of the third doped layers 16A to 110% of the impurity concentration of each of the third doped layers 16A, and the impurity concentration within this range can still reduce the negative influence of the impurity concentration variation between the second source/drain structure 44P and the third doped layer 16A on the operation of the second transistor T2, but not limited thereto.

In some embodiments, the first transistor T1 may be disposed between the substrate 10 and the second transistor T2 in the first direction D1, and the first semiconductor sheets 14P of the first transistor T1 may be disposed between the substrate 10 and the second semiconductor sheets 16P of the second transistor T2 in the first direction D1. In some embodiments, the semiconductor device 101 may include a gate structure GS disposed on the substrate 10, and the first transistor T1 and the second transistor T2 stacked in the first direction D1 may share the gate structure GS. For example, the first transistor T1 may include a first portion S1 of the gate structure GS, and the second transistor T2 may include a second portion S2 of the gate structure GS. The first portion S1 of the gate structure GS may encompass each of the first semiconductor sheets 14P, and the second portion S2 of the gate structure GS may encompass each of the second semiconductor sheets 16P. The first portion S1 of the gate structure GS may be directly connected with the second portion S2 of the gate structure GS, and the first portion S1 of the gate structure GS may be disposed between the second portion S1 of the gate structure GS and the substrate 10 in the first direction D1. Therefore, the first transistor T1 and the second transistor T2 may be regarded a gate-all-around (GAA) transistor structure respectively, but not limited thereto. In some embodiments, the gate structure GS may include a gate dielectric layer 56 and a gate material layer 58, but not limited thereto. In the first portion S1 of the gate structure GS, the gate dielectric layer 56 may be disposed between the gate material layer 58 and each of the first semiconductor sheets 14P. In the second portion S2 of the gate structure GS, the gate dielectric layer 56 may be disposed between the gate material layer 58 and each of the second semiconductor sheets 16P.

In some embodiments, at least a portion of each of the first source/drain structures 34P of the first transistor T1 may be disposed between the substrate 10 and one of the two second source/drain structures 44P of the second transistor T2 in the first direction D1, and the semiconductor device 101 may further include a dielectric layer 42 disposed between the first source/drain structure 34P and the second source/drain structure 44P in the first direction D1, but not limited thereto. In some embodiments, the first source/drain structure 34P and the second source/drain structure 44P at least partially overlapping each other in the first direction D1 may be electrically connected with each of other via a connection structure (not shown), or the first source/drain structure 34P may have a region without overlapping the second source/drain structure 44P for forming a corresponding contact structure (not shown) on the region, but not limited thereto.

In some embodiments, the semiconductor device 101 may further include a spacer 28, a spacer 32, an etching stop layer 52, and a dielectric layer 54. The spacer 32 may be disposed on sidewalls of a relatively lower portion of the gate structure GS (such as the first portion S1 and a part of the second portion S2 described above), and the spacer 28 may be disposed on sidewalls of a relatively upper portion of the gate structure GS. Therefore, in some embodiments, a part of the spacer 32 may be disposed between the gate structure GS and the first source/drain structure 34P in the second direction D2, and another part of the spacer 32 may be disposed between the gate structure GS and the second source/drain structure 44P in the second direction D2. In addition, the etching stop layer 52 may be disposed on sidewalls of the spacer 28 and the second source/drain structures 44P, and the dielectric layer 54 may be disposed on the etching stop layer 52.

In some embodiments, the semiconductor device 101 may include a plurality of the first transistors T1 and a plurality of the second transistors T2. The first transistors T1 may be disposed and arranged in the second direction D2, and the first transistors T1 disposed adjacent to each other may share one of the first source/drain structures 34P; and the second transistors T2 may be disposed and arranged in the second direction D2, and the second transistors T2 disposed adjacent to each other may share one of the second source/drain structures 44P, but not limited thereto. The area occupied by the semiconductor device 101 may be reduced by stacking the first transistor T1 and the second transistor T2 sharing the gate structure GS in the first direction D1, and it is beneficial to the density improvement of the transistors in related products.

In some embodiments, the substrate 10 may include a semiconductor substrate, such as a silicon substrate, an epitaxial silicon substrate, a silicon germanium substrate, a silicon carbide substrate, or a silicon-on-insulator (SOI) substrate, but not limited thereto. The first semiconductor sheets 14P and the second semiconductor sheets 16P may include a semiconductor material, respectively, such as silicon, silicon germanium, or other suitable semiconductor materials. In some embodiments, the first doped layer 14A and the second doped layer 14B may be formed by doping the same semiconductor material with impurities having different conductivity types, and the third doped layer 16A and the fourth doped layer 16B may be formed by doping the same semiconductor material with impurities having different conductivity types, but not limited thereto. In some embodiments, the first doped layer 14A and the second doped layer 14B may be different semiconductor materials including impurities having different conductivity types respectively, and the third doped layer 16A and the fourth doped layer 16B may be different semiconductor materials including impurities having different conductivity types respectively.

The first source/drain structure 34P and the second source/drain structure 44P may include an epitaxial material, respectively, such as epitaxial silicon, epitaxial silicon germanium (SiGe), epitaxial silicon phosphide (SiP), or other suitable epitaxial materials. The spacer 28 and the spacer 32 may respectively be a single layer or multiple layers of insulation materials, such as silicon oxide, silicon nitride, silicon oxynitride, or other suitable insulation materials. The dielectric layer 42, the etching stop layer 52, and the dielectric layer 54 may include silicon oxide, silicon nitride, silicon oxynitride, a low dielectric constant (low-k) dielectric material, or other suitable insulation materials, respectively. The gate dielectric layer 56 may include a high dielectric constant (high-k) dielectric material or other suitable dielectric materials. The high-k dielectric material described above may include hafnium oxide ($HfO_x$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The gate material layer 58 may include a nonmetallic electrically conductive material (such as doped polysilicon) or a metallic electrically conductive material, such as a metal gate structure formed with a work function layer and a low electrical resistivity layer stacked with each other, but not limited thereto. The work function layer described above may include titanium nitride (TiN), titanium carbide (TiC), tantalum nitride (TaN), tantalum carbide (TaC), tungsten carbide (WC), titanium tri-aluminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials.

Figure 4:
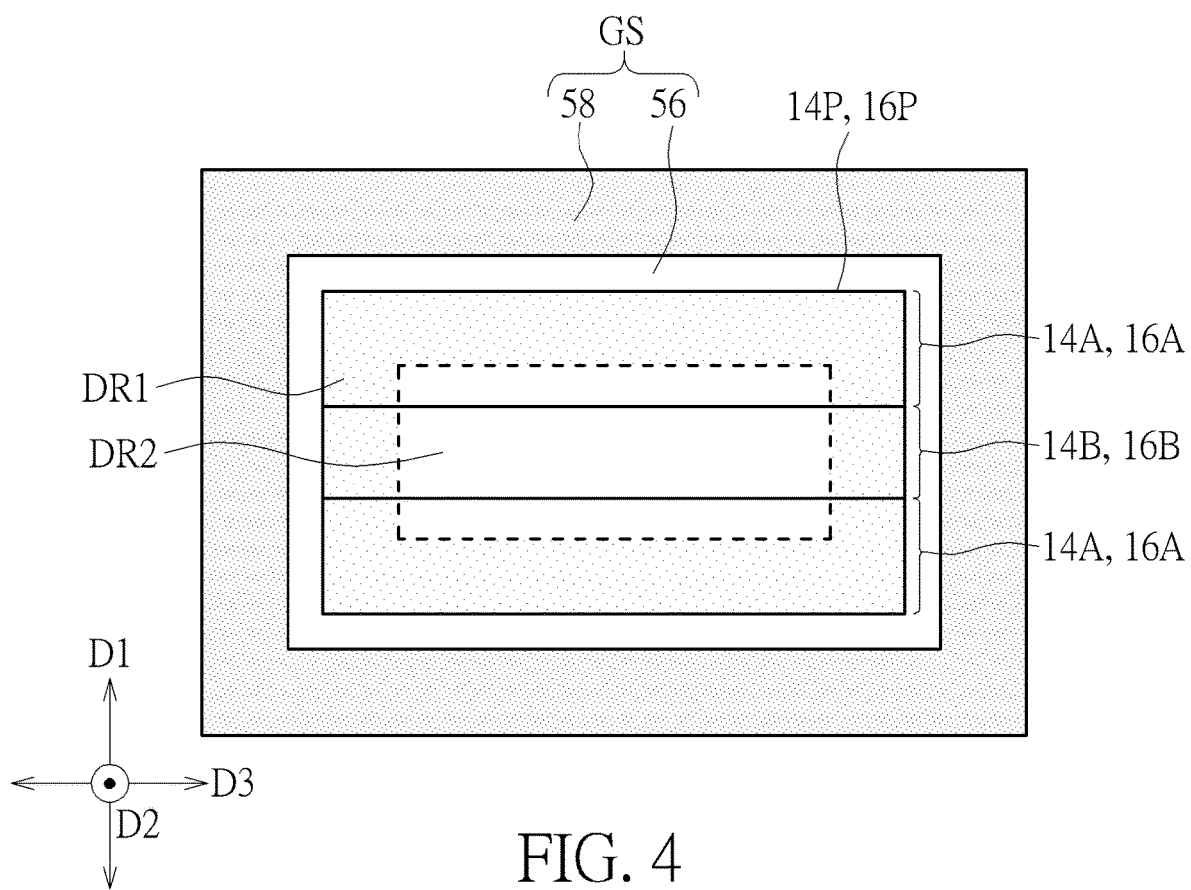
FIG. 4 is a schematic drawing illustrating the first semiconductor sheet or the second semiconductor sheet in an operation state according to the first embodiment of the present invention.
Figure 5:
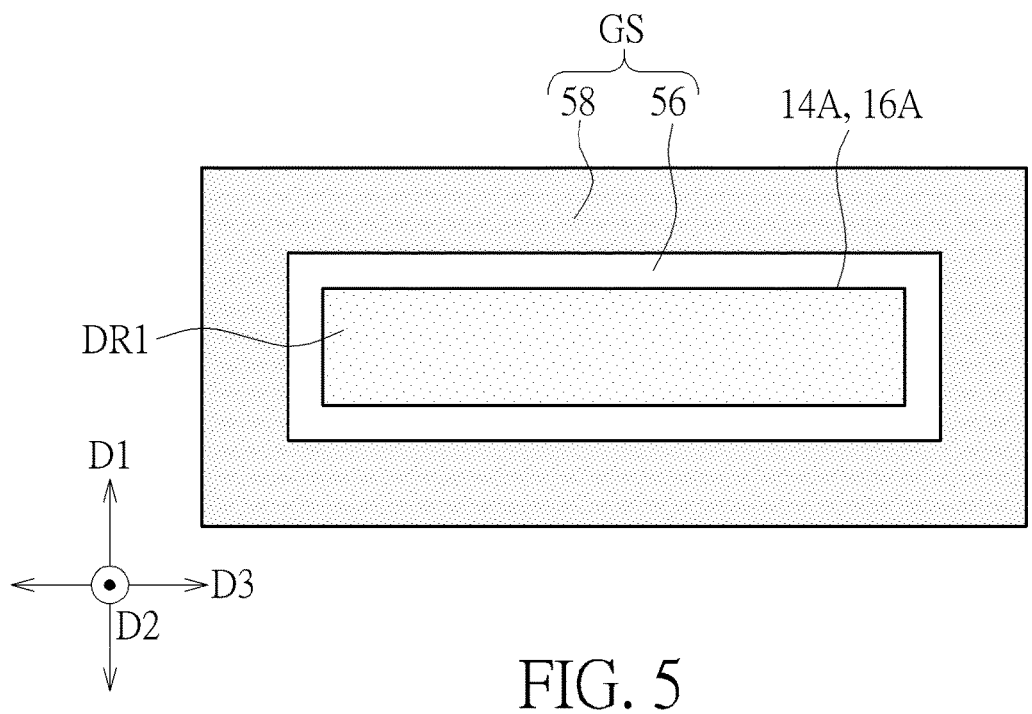
FIG. 5 is a schematic drawing illustrating a semiconductor sheet in an operation state according to another embodiment of the present invention.
Figure 6:
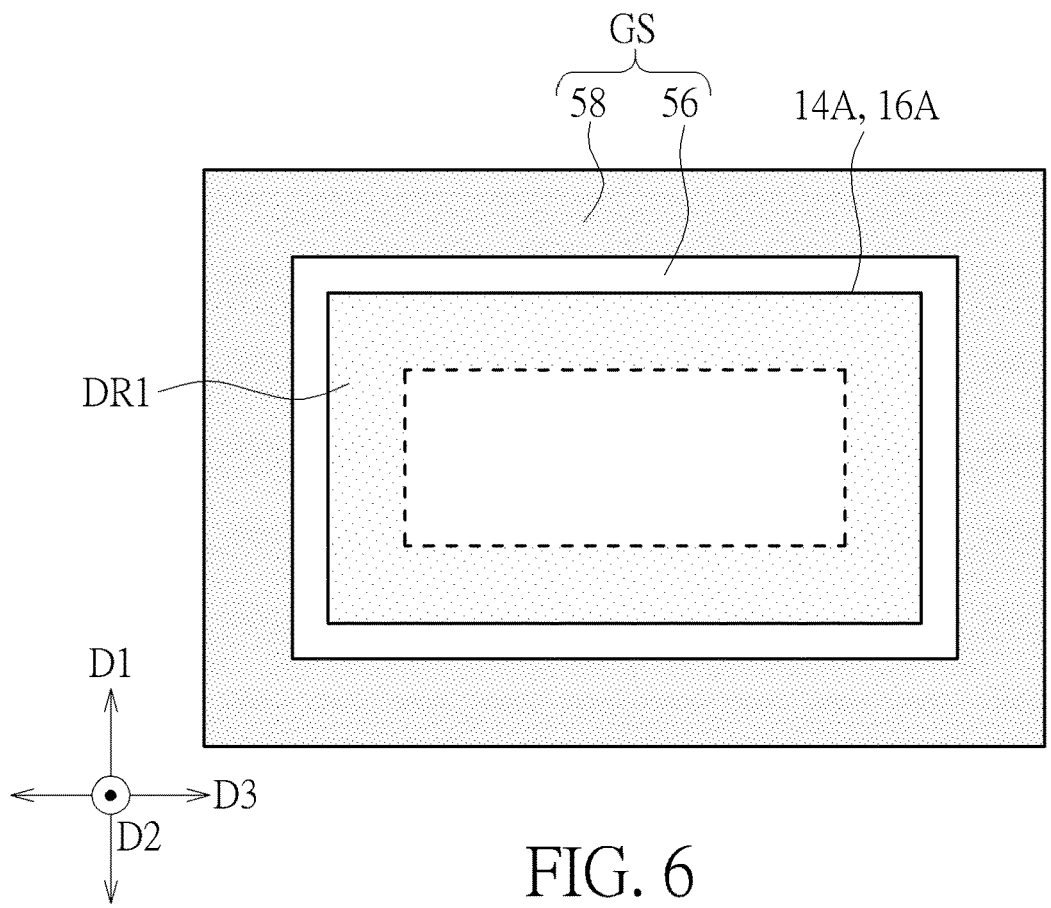
FIG. 6 is a schematic drawing illustrating a semiconductor sheet in an operation state according to further another embodiment of the present invention.

Please refer to FIG. 1 and FIGS. 4-6. FIG. 4 is a schematic drawing illustrating the first semiconductor sheet 14P or the second semiconductor sheet 16P in an operation state according to the this embodiment, FIG. 5 is a schematic drawing illustrating a semiconductor sheet in an operation state according to another embodiment of the present invention, and FIG. 6 is a schematic drawing illustrating a semiconductor sheet in an operation state according to further another embodiment of the present invention. As shown in FIG. 1 and FIG. 4, the gate structure GS may encompass the each of the first semiconductor sheets 14P and each of the second semiconductor sheets 16P in the first direction D1 and the third direction D3. In the operation of the first transistor T1 and the operation of the second transistor T2, each of the first semiconductor sheets 14P and each of the second semiconductor sheets 16P may reach a full depletion state (or become fully depleted), respectively, and a first depletion region DR1 and a second depletion region DR2 encompassed by the first depletion region DR1 may be formed in each of the first semiconductor sheets 14P and each of the second semiconductor sheets 16P because the first doped layer 14A and the second doped layer 14B in each of the first semiconductor sheets 14P have different conductivity types and the third doped layer 16A and the fourth doped layer 16B in each of the second semiconductor sheets 16P have different conductivity types. The first depletion region DR1 may be regarded as a depletion region induced by the gate structure GS, and the second depletion region D2 may be regarded as a depletion region induced by the second doped layer 14B and the fourth doped layer 16B. By the full depletion state and the second depletion region DR2 for altering electric field distribution, the scattering rate may be reduced for enhancing the carrier mobility, the leakage current at the center part of the channel region may be improved, and the electrical capacitance of the depletion region may be reduced, and the electrical performance of the first transistor T1 and the second transistor T2 may be improved accordingly. For example, the drain current variation, the subthreshold swing variation with temperature, and the breakdown voltage may be improved and/or enhanced accordingly, but not limited thereto.

Comparatively, the effects described above cannot be achieved when the semiconductor sheet consists of a single doped layer. For example, as shown in FIG. 5, when the semiconductor sheet consists of a single doped layer (such as the first doped layer 14A or the third doped layer 16A) and is relatively thinner (such as having a thickness less than 10 nanometers), a full depletion state may be formed still, but the carrier scattering rate tends to be increased and the carrier mobility will be decreased because there is the first depletion region DR1 induced by the gate structure GS only. In addition, as shown in FIG. 6, when the semiconductor sheet consists of a single doped layer (such as the first doped layer 14A or the third doped layer 16A) and is relatively thicker, the carrier scattering rate may be reduced for enhancing the carrier mobility, but only a partial depletion state is formed, and leakage current tends to be generated at the center portion of the channel region encompassed by the first depletion region DR. The integrated electrical performance will be influenced accordingly.

Figure 7:
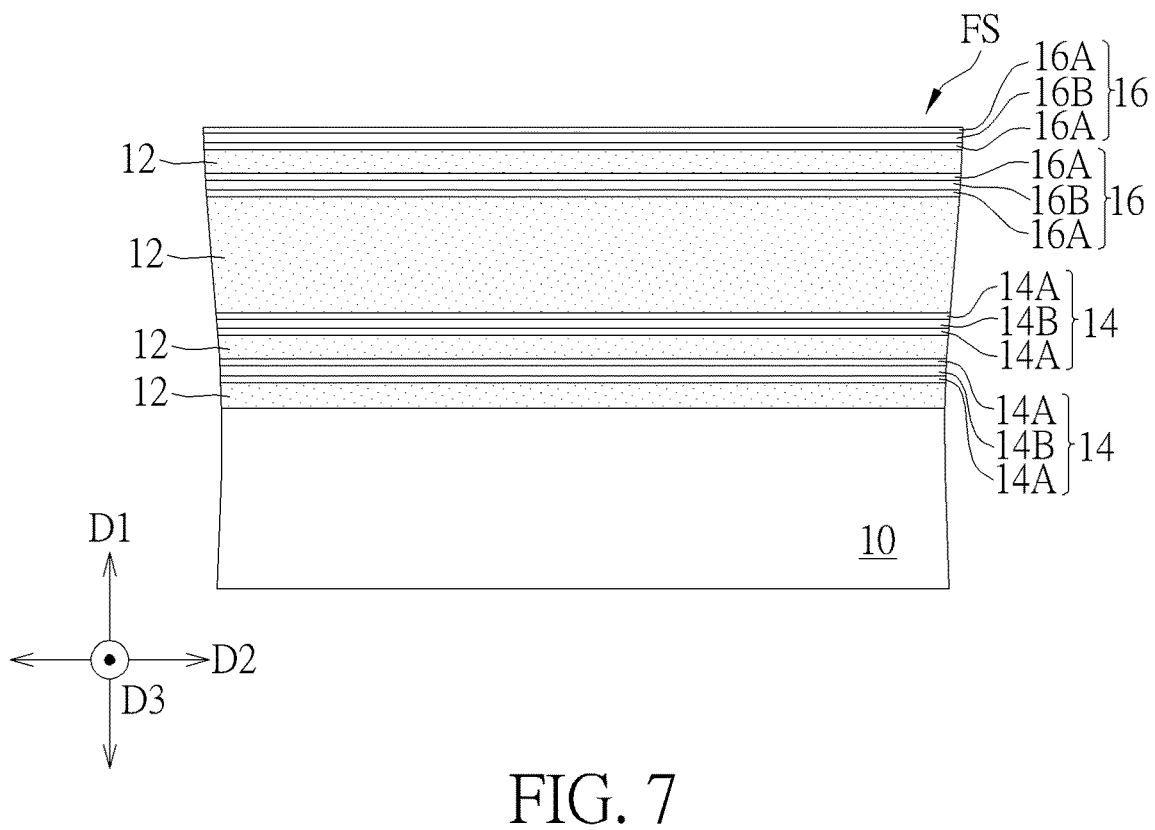
Figure 8:
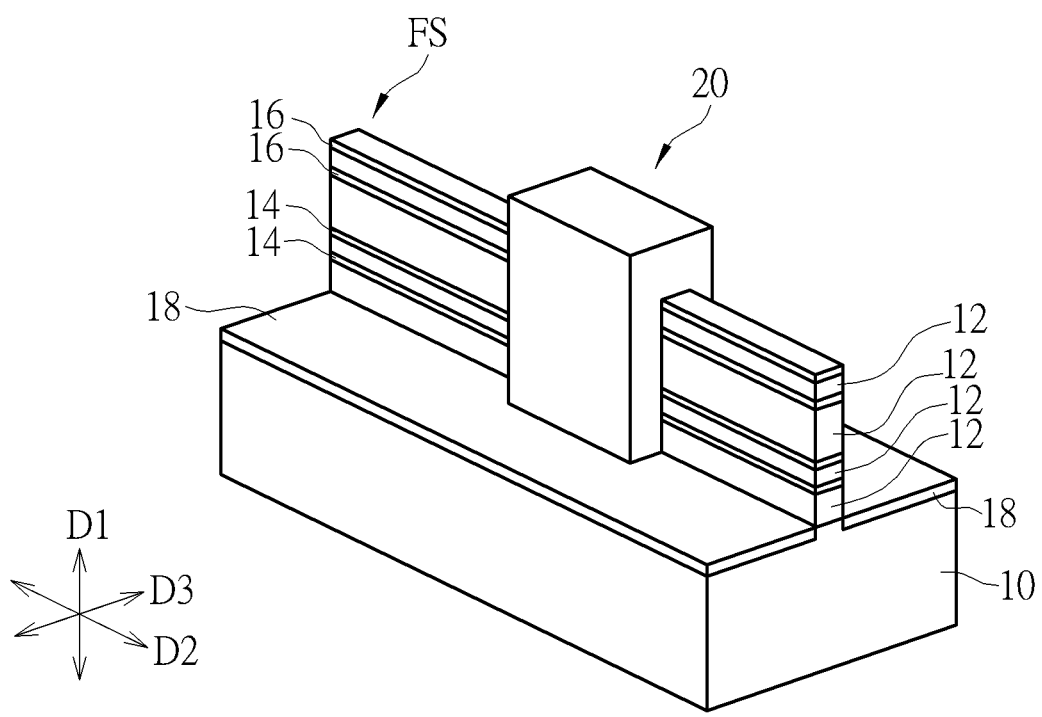
Figure 9:
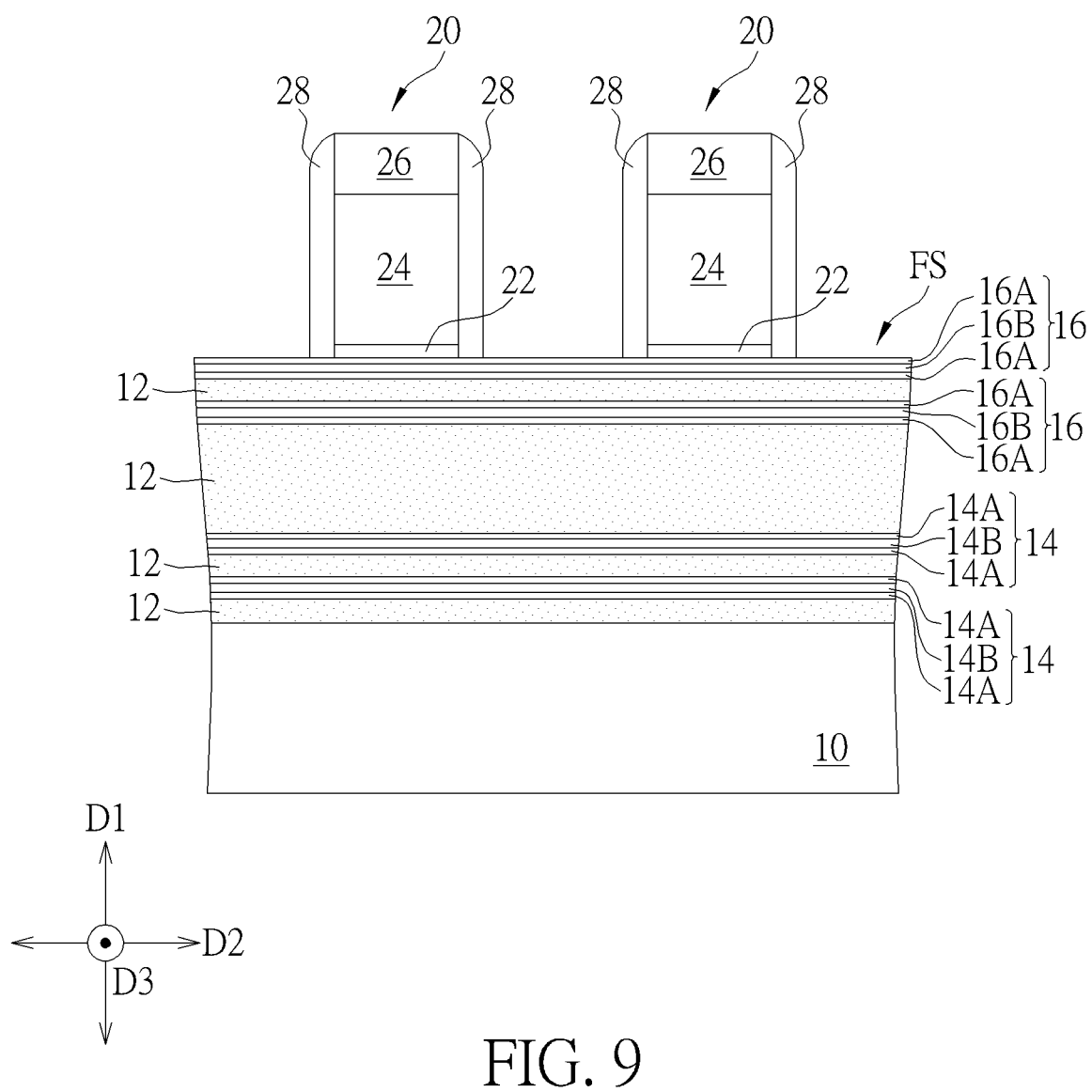
Figure 10:
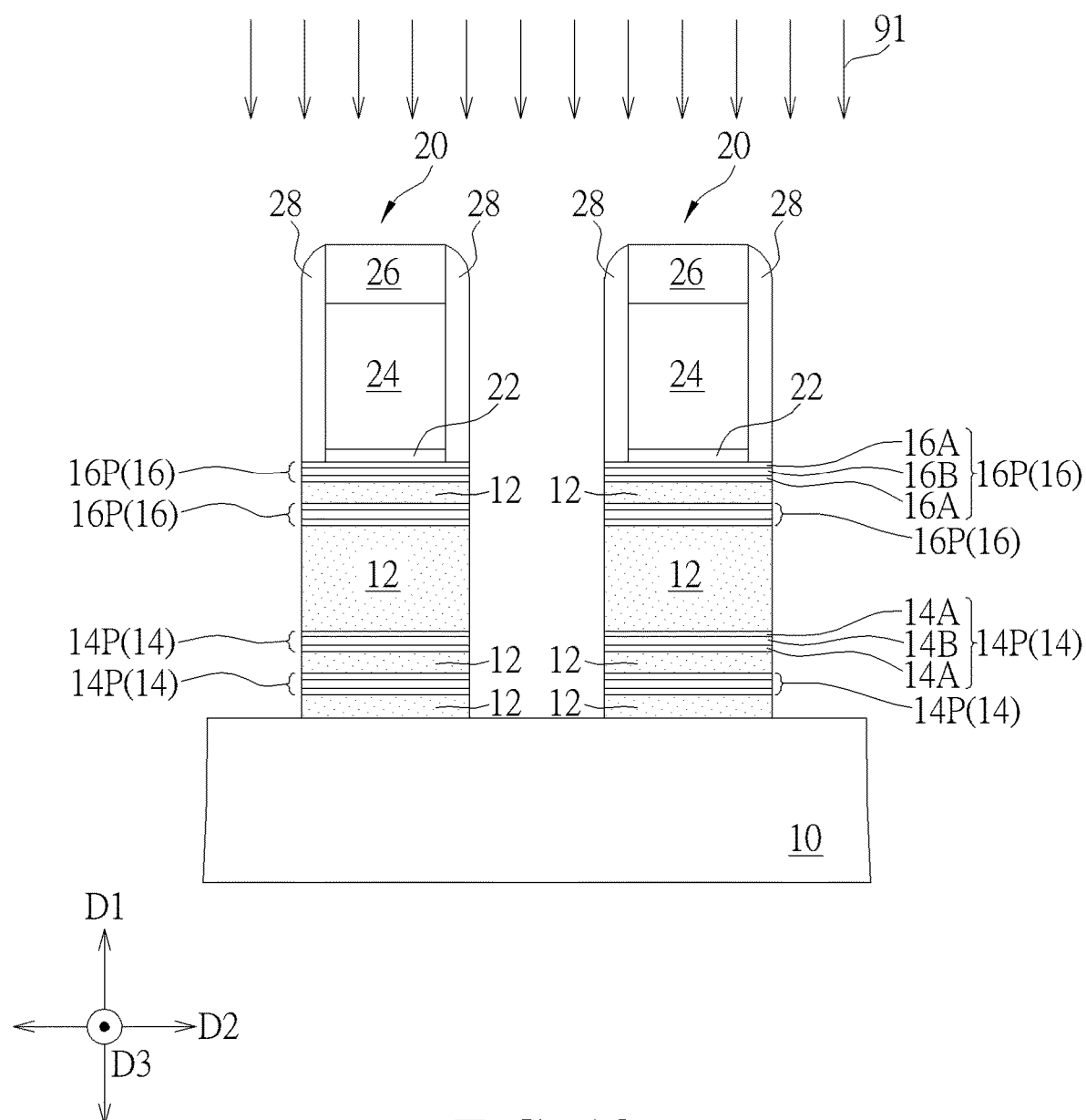
Figure 11:
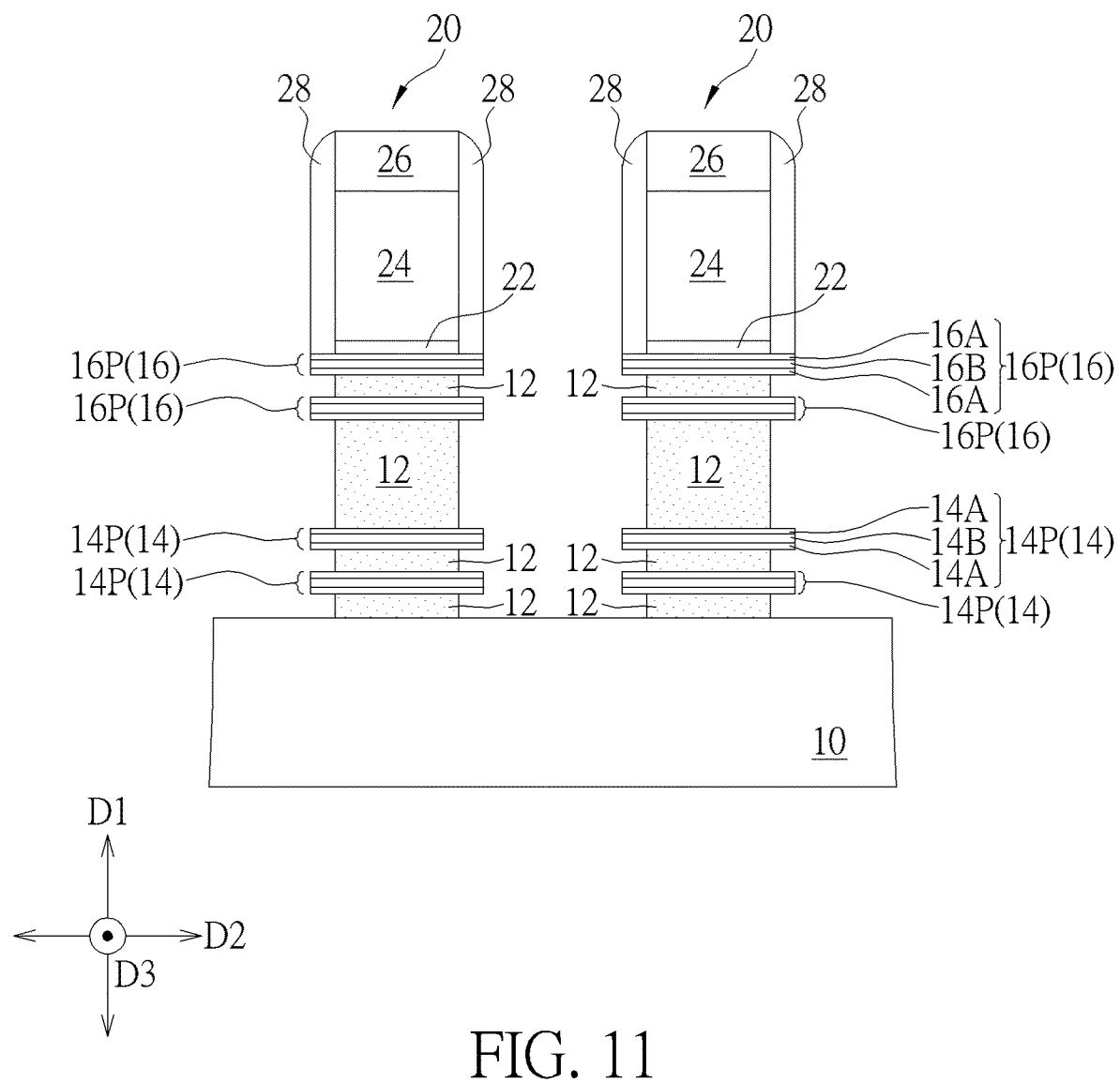
Figure 12:
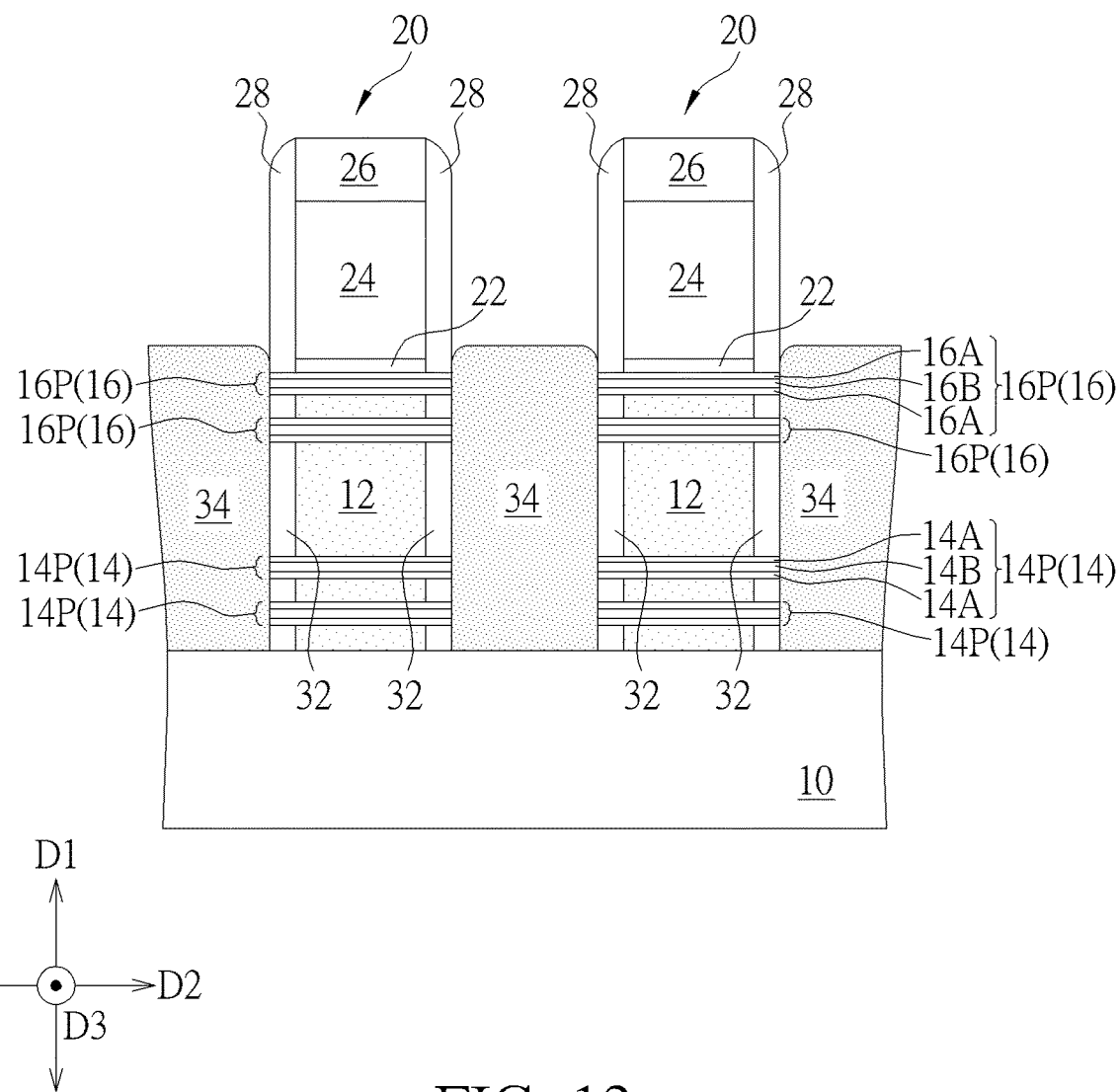
Figure 13:
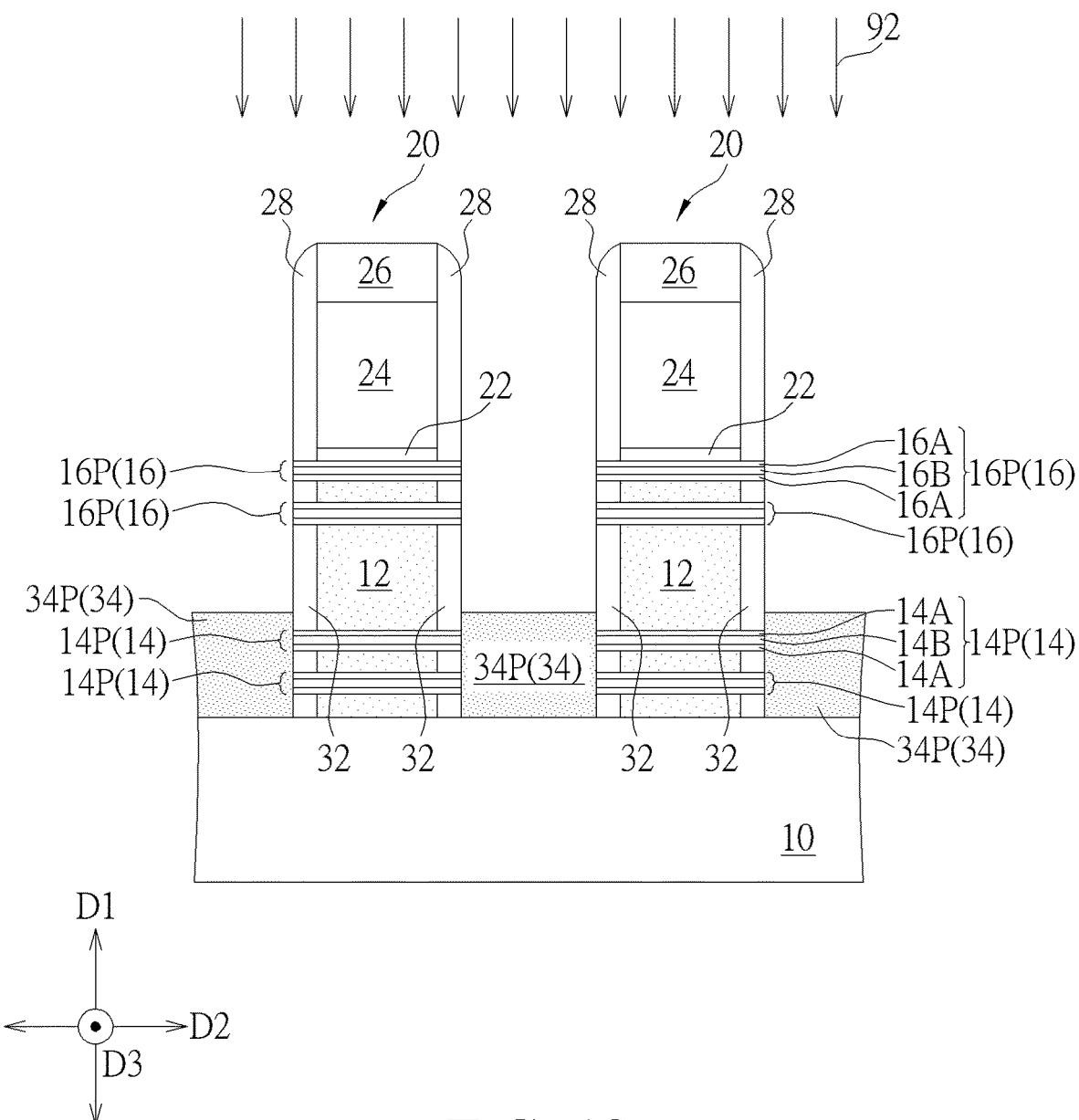
Figure 14:
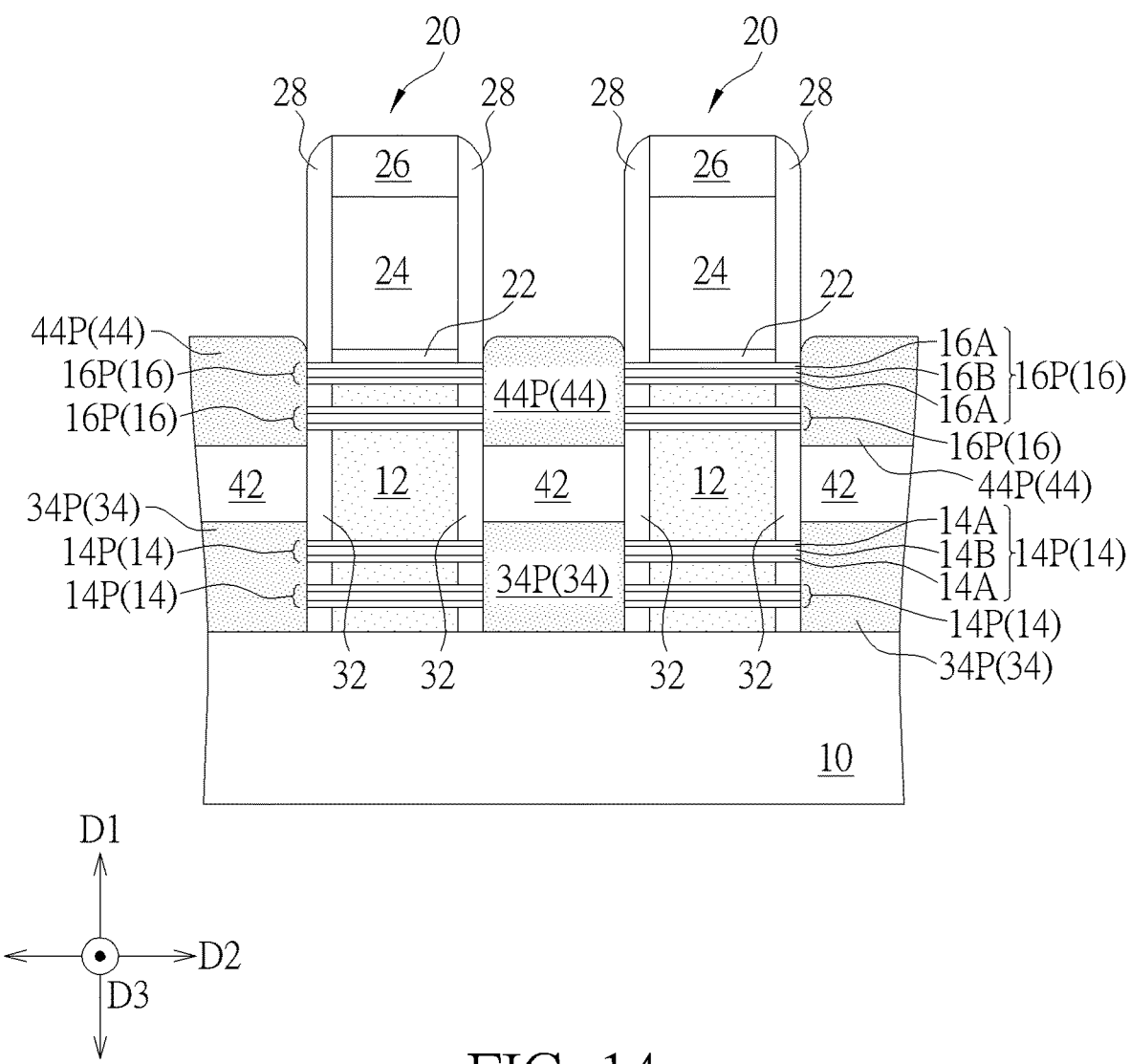
Figure 15:
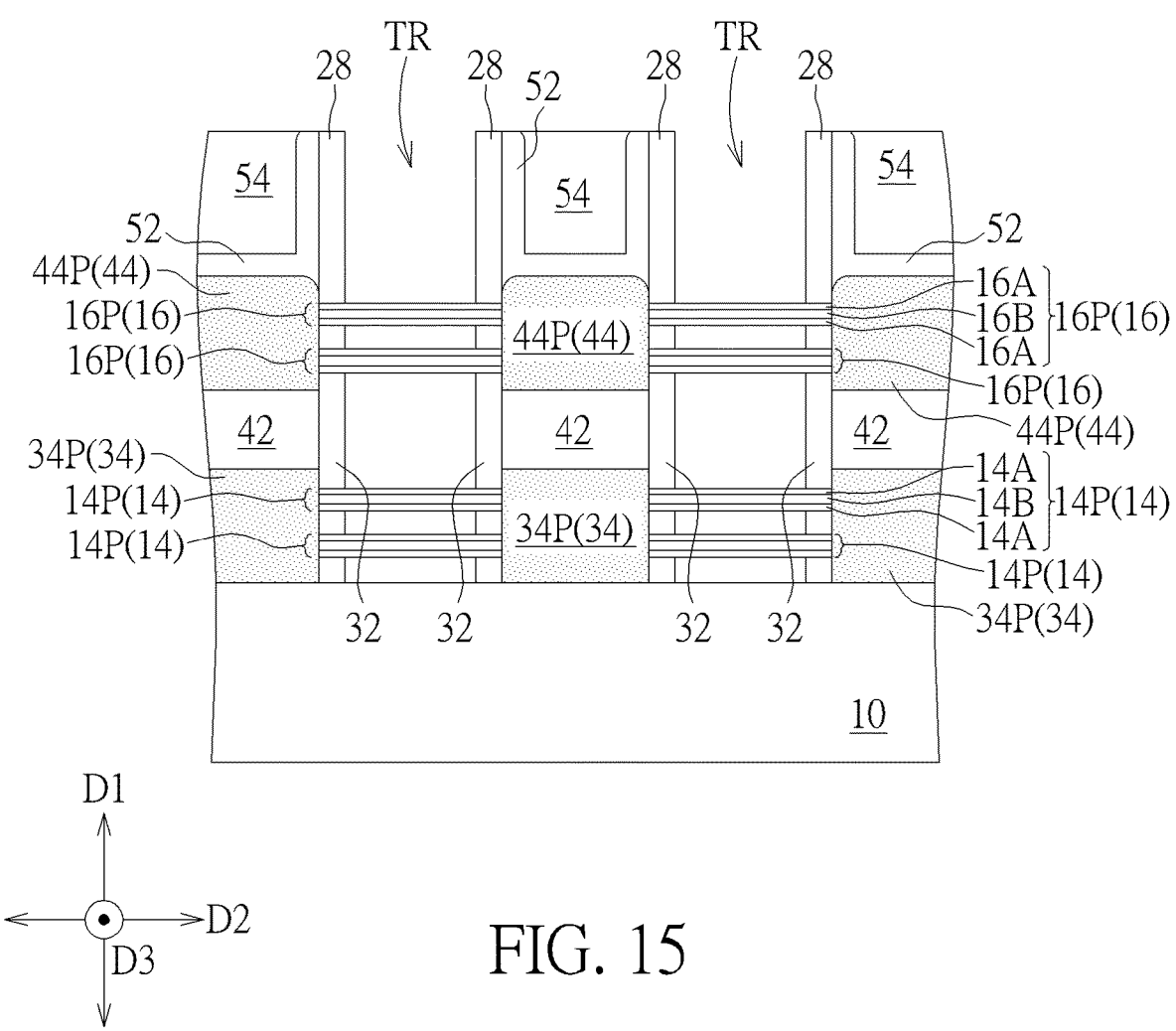

Please refer to FIG. 1 and FIGS. 7-15. FIGS. 7-15 are schematic drawings illustrating a manufacturing method of the semiconductor device in this embodiment, wherein FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, and FIG. 1 may be regarded as a schematic drawing in a step subsequent to FIG. 15. As shown in FIG. 1, a manufacturing method of the semiconductor device 101 in this embodiment may include the following steps. Firstly, the substrate 10 is provided, and the first transistor T1 and the second transistor T2 are formed on the substrate 10. The first transistor T1 includes a plurality of the first semiconductor sheets 14P and the two first source/drain structures 34P. The first semiconductor sheets 14P are stacked in a vertical direction (such as the first direction D1) and separated from one another. Each of the first semiconductor sheets 14P includes two first doped layers 14A and the second doped layer 14B disposed between the two first doped layers 14A in the first direction D1. The conductivity type of the second doped layer 14B is complementary to the conductivity type of each of the two first doped layers 14A. The two first source/drain structures 34P are disposed at two opposite sides of each of the first semiconductor sheets 14P in a horizontal direction (such as the second direction D2) respectively, and the two first source/drain structures 34P are connected with the first semiconductor sheets 14P. The second transistor T2 includes a plurality of the second semiconductor sheets 16P and two second source/drain structures 44P. The second semiconductor sheets 16P may be stacked in the first direction D1 and separated from one another, and each of the second semiconductor sheets 16P may include two third doped layers 16A and the fourth doped layer 16B disposed between the two third doped layers 16A in the first direction D1. The two second source/drain structures 44P may be disposed at two opposite sides of each of the second semiconductor sheets 16P in the second direction D2 respectively, and the second source/drain structures 44P may be connected with the second semiconductor sheets 16P.

Specifically, the manufacturing method of the semiconductor device 101 in this embodiment may include but is not limited to the following steps. Firstly, as shown in FIG. 7, a stacked structure FS may be formed on the substrate 10, and the stacked structure FS includes a plurality of first semiconductor stacked structures 14, a plurality of second semiconductor stacked structures 16, and a sacrificial material 12. Each of the first semiconductor stacked structures 14 may include two first doped layers 14A and one second doped layer 14B sandwiched between the two first doped layers 14A in the first direction D1, and each of the second semiconductor stacked structures 16 may include two third doped layers 16A and one fourth doped layer 16B sandwiched between the two third doped layers 16A in the first direction D1. The first semiconductor stacked structures 14 may be stacked in the first direction D1, and the second semiconductor stacked structures 16 may be disposed above the first semiconductor stacked structures 14 and stacked in the first direction D1. The sacrificial material 12 may be partly disposed between the first semiconductor stacked structures 14, partly disposed between the second semiconductor stacked structures 16, and partly disposed between the first semiconductor stacked structures 14 and the second semiconductor stacked structures 16. In other words, the sacrificial material 12 and the first semiconductor stacked structures 14 may be alternately stacked in a lower portion of the stacked structure FS, and the sacrificial material 12 and the second semiconductor stacked structures 16 may be alternately stacked in an upper portion of the stacked structure FS, but not limited thereto.

In some embodiments, the material composition of the sacrificial material 12 may be different from the material composition of the first semiconductor stacked structures 14 and the material composition of the second semiconductor stacked structures 16 for providing required etching selectivity. For example, in some embodiments, the material of the first semiconductor stacked structures 14 and the second semiconductor stacked structures 16 may be a silicon semiconductor material, and the material of the sacrificial material 12 may be silicon germanium (SiGe) for constituting a superlattice epitaxial structure, but not limited thereto. In some embodiments, other material combinations may be used to form the stacked structures FS according to some design considerations. Additionally, the first doped layer 14A and the second doped layer 14B in each of the first semiconductor stacked structures 14 and the third doped layer 16A and the fourth doped layer 16B in each of the second semiconductor stacked structures 16 may be formed by performing different doping processes to the semiconductor material, but not limited thereto. In some embodiments, the first doped layer 14A, the second doped layer 14B, the third doped layer 16A, and the fourth doped layer 16B may also be formed by other suitable manufacturing approaches according to some design considerations. For example, each of the doped layers described above may be directly formed by performing in-situ doping in the corresponding film forming process. Additionally, in some embodiments, the sacrificial material 12, the first semiconductor stacked structures 14, and the second semiconductor stacked structures 16 may be formed globally and stacked on the substrate 10, and a patterning process may be performed to the sacrificial material 12, the first semiconductor stacked structures 14, and the second semiconductor stacked structures 16 for forming the stacked structures FS separated from one another, but not limited thereto.

Subsequently, as shown in FIGS. 7-9, a dummy gate structure 20 may be formed on the stacked structure FS, and the dummy gate structure 20 may be disposed straddling two opposite sides of the stacked structure FS in the third direction D3. In some embodiments, the dummy gate structure 20 may include a dielectric layer 22, a dummy gate material 24, and a gate cap layer 26. The dielectric layer 22 may include oxide or other suitable dielectric materials, the dummy gate material 24 may include polysilicon, amorphous silicon, or other suitable materials, and the gate cap layer 26 may include nitride, oxynitride, or other suitable insulation materials, but not limited thereto. In some embodiments, a plurality of the stacked structures FS may be formed on the substrate 10, each of the stacked structures FS may be substantially elongated in the second direction D2, and an isolation structure 18 may be disposed in the substrate 10 located between the stacked structures FS adjacent to each other, but not limited thereto. The isolation structure 18 may include a single layer or multiple layers of insulation materials, such as oxide insulation materials (silicon oxide, for example), or other suitable insulation materials. In some embodiments, the stacked structure FS may be regarded as a fin-shaped structure extending in the second direction D2, and the dummy gate structure 20 may extend in the third direction D3 substantially orthogonal to the second direction D2 and be disposed straddling the stacked structures FS, but not limited thereto.

Subsequently, as shown in FIG. 9 and FIG. 10, the spacer 28 may be formed on sidewalls of the dummy gate structure 20, and a patterning process 91 may be performed to the stacked structure FS with the dummy gate structure 20 and the spacer 28 as a mask. In some embodiments, the patterning process 91 may include an etching process or other suitable patterning approaches. Each of the first semiconductor stacked structures 14 may be patterned to be the first semiconductor sheets 14P by the patterning process 91, and each of the second semiconductor stacked structures 16 may be patterned to be the second semiconductor sheets 16P by the patterning process 91. In some embodiments, the projection shape and/or the projection area of each of the first semiconductor sheets 14P in the first direction D1 may be substantially the same as that of each of the second semiconductor sheets 16P in the first direction D1 after the patterning process 91 because the patterning process 91 may be performed to the stacked structure FS with the dummy gate structure 20 and the spacer 28 as a mask, but not limited thereto. It is worth noting that the method of forming the first semiconductor sheets 14P and the second semiconductor sheets 16P in this embodiment may include but is not limited to the steps shown in FIGS. 7-10 described above. In some embodiments, the first semiconductor sheets 14P and the second semiconductor sheets 16P may be formed by other suitable approaches according to some process and/or design considerations.

Subsequently, as shown in FIG. 10 and FIG. 11, a recessing process may be performed to the sacrificial material 12 for reducing the length of the sacrificial material 12 in the second direction D2 and further exposing a part of each of the first semiconductor sheets 14P and a part of each of the second semiconductor sheets 16P. The recessing process described above may include an etching process having high etching selectivity between the sacrificial material 12, the first semiconductor sheets 14P, and the second semiconductor sheets 16P for reducing negative influence on the first semiconductor sheets 14P and the second semiconductor sheets 16P, but not limited thereto. As shown in FIG. 11 and FIG. 12, the spacer 32 may then be formed on the sidewalls of the sacrificial material 12, and a first epitaxial material 34 may be formed on the substrate 10 after the step of forming the spacer 32. In some embodiments, an epitaxial growth process may be carried out from the substrate 10, an edge of each of the first semiconductor sheets 14P, and/or an edge of each of the second semiconductor sheets 16P for forming the first epitaxial material 34, and the first epitaxial material 34 may be connected with each of the first semiconductor sheets 14P and each of the second semiconductor sheets 16P accordingly, but not limited thereto. Subsequently, as shown in FIG. 12 and FIG. 13, a recessing process 92 may be performed to the first epitaxial material 34 for removing a part of the first epitaxial material 34 in order to partially expose side surfaces of each of the second semiconductor sheets 16P and form the first source/drain structures 34P with the first epitaxial material 34 remaining on the substrate 10. In other words, at least a part of the first epitaxial material 34 may be etched to be the first source/drain structures 34P by the recessing process 92, but not limited thereto. It is worth noting that the method of forming the first source/drain structures 34P in this embodiment may include but is not limited to the steps in FIG. 12 and FIG. 13 described above. In some embodiments, the first source/drain structures 34P may be formed by other suitable approaches according to some process and/or design considerations. For example, the dimension of the first epitaxial material 34 at the time of formation may be controlled for directly forming the first source/drain structures 34P without performing the recessing process 92 described above, but not limited thereto.

Subsequently, as shown in FIG. 14, the dielectric layer 42 may be formed on the first source/drain structures 34P, and the second source/drain structures 44P may be formed on the dielectric layer 42. In some embodiments, a second epitaxial material 44 may be formed by performing an epitaxial growth process from the exposed edges of each of the second semiconductor sheets 16P, and the second epitaxial material 44 may be directly connected with the second semiconductor sheets 16P accordingly. The required second source/drain structures 44P may be formed at two opposite sides of each of the second semiconductor sheets 16P in the second direction D2 by controlling the formation of the second epitaxial material 44 (such as controlling the process time for forming the second epitaxial material 44). In some embodiments, a portion of the first source/drain structure 34P may not overlap the second source/drain structure 44P in the first direction D1 by removing a part of the second source/drain structure 44P, and the space for forming the contact structure corresponding to the first source/drain structure 34P may be generated accordingly, but not limited thereto. In addition, the method of forming the second source/drain structures 44P in this embodiment may include but is not limited to the steps in FIG. 13 and FIG. 14 described above. In some embodiments, the second source/drain structures 44P may be formed by other suitable approaches according to some process and/or design considerations.

As shown in FIG. 14, FIG. 15, and FIG. 1, in some embodiments, the gate structure GS may be formed by replacing the dummy gate structure 20 and the sacrificial material 12 with the gate dielectric layer 56 and the gate material layer 58. Specifically, as shown in FIG. 14 and FIG. 15, the etching stop layer 52 and the dielectric layer 54 may be formed after the step of forming the second source/drain structures 44P, and a planarization process may be performed for removing the gate cap layer 26, a part of the dielectric layer 54, and a part of the etching stop layer 52 and exposing the dummy gate structure 20. The planarization process described above may include a chemical mechanical polishing (CMP) process, an etching back process, or other suitable planarization approaches. After the planarization process described above, the exposed dummy gate structure 20 and the sacrificial material 12 may be removed for forming a trench TR. The trench TR may be surrounded by the spacer 28 and the spacer 32 in the horizontal directions, and each of the first semiconductor sheets 14P and each of the second semiconductor sheets 16P may be partly disposed in the trench TR. Subsequently, as shown in FIG. 15 and FIG. 1, the gate dielectric layer 56 and the gate material layer 58 may be formed sequentially, and the trench TR may be filled with a part of the gate dielectric layer 56 and a part of the gate material layer 58. In some embodiments, another planarization process may then be performed for removing the gate dielectric layer 56 and the gate material layer 58 outside the trench TR and forming the gate structure GS in the trench TR. The method of forming the gate structure GS in this embodiment may include but is not limited to the steps in FIG. 14, FIG. 15, and FIG. 1 described above. In some embodiments, the gate structure GS may be formed by other suitable approaches according to some process and/or design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 16:
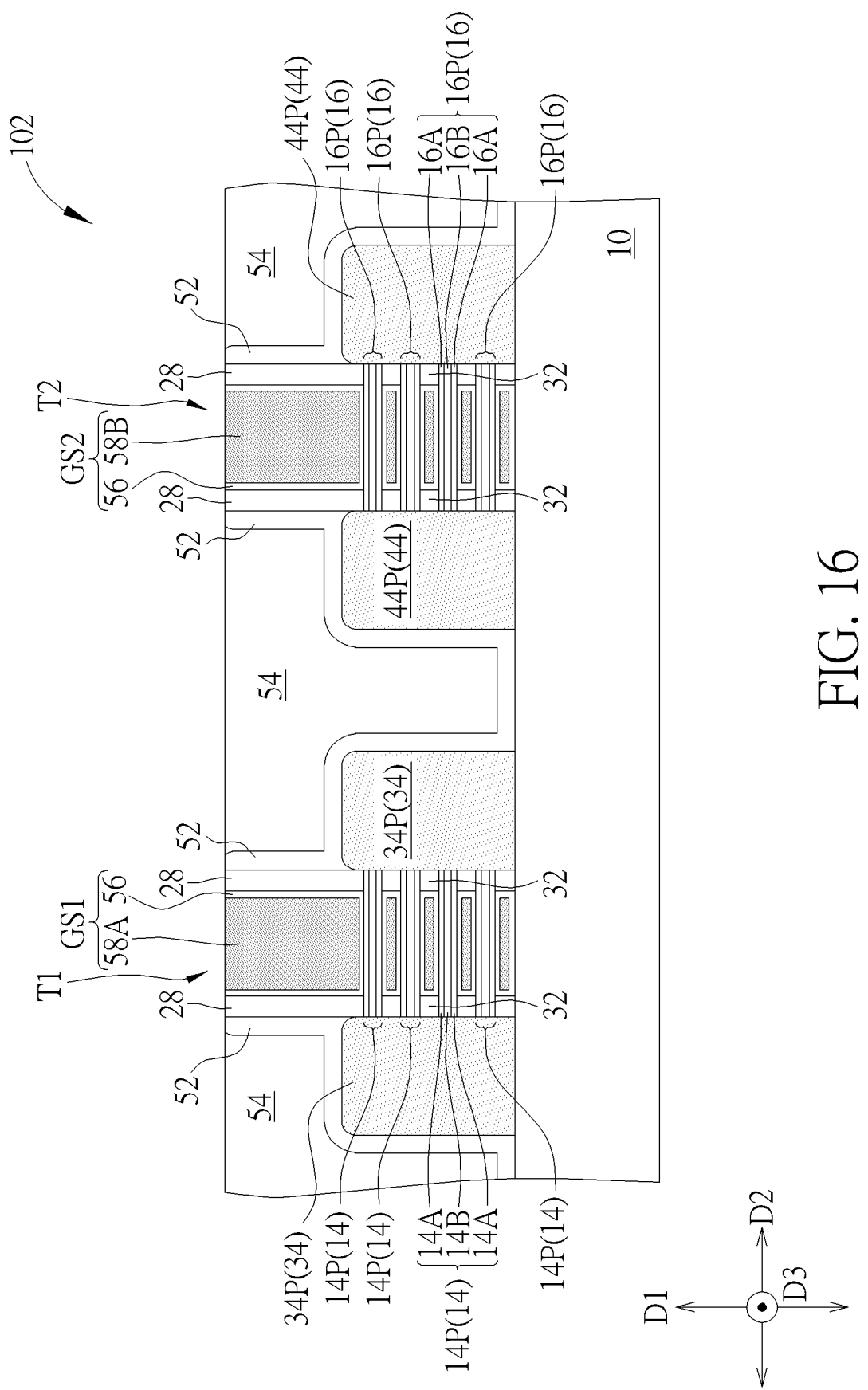
FIG. 16 is a schematic drawing illustrating a semiconductor device according to a second embodiment of the present invention.

Please refer to FIG. 16. FIG. 16 is a schematic drawing illustrating a semiconductor device 102 according to a second embodiment of the present invention. As shown in FIG. 16, in the semiconductor device 102, the first transistor T1 and the second transistor T2 may be disposed on the same plane without overlapping each other in the first direction D1. In this configuration, the first transistor T1 may include a first gate structure GS1, and the second transistor T2 may include a second gate structure GS2. The first gate structure GS1 may encompass each of the first semiconductor sheets 14P, and the two first source/drain structures 34P may be disposed at two opposite sides of the first gate structure GS1 in the horizontal direction (such as the second direction D2) respectively. The second gate structure GS2 may encompass each of the second semiconductor sheets 16P, and the two second source/drain structures 44P may be disposed at two opposite sides of the second gate structure GS2 in the horizontal direction (such as the second direction D2) respectively. In some embodiments, the first gate structure GS1 and the second gate structure GS2 may be separated from each other, but not limited thereto. In some embodiments, the first gate structure GS1 and the second gate structure GS2 may be disposed adjacent to each other in the third direction D3, the first gate structure GS1 and the second gate structure GS2 may be different portion of a gate structure extending in the third direction D3, and the first gate structure GS1 and the second gate structure GS2 may be electrically connected with each other accordingly, but not limited thereto. In addition, the first gate structure GS1 may include a first gate material layer 58A, the second gate structure GS2 may include a second gate material layer 58B, and a material composition of the first gate material layer 58A and the second gate material layer 58B may be similar to that of the gate material layer in the first embodiment described above, but not limited thereto. In some embodiments, the material composition of the first gate material layer 58A may be identical to or different from the material composition of the second gate material layer 58B according to some design considerations. For example, when the first transistor T1 and the second transistor T2 are transistors of different types (such as an n-type transistor and a p-type transistor), the first gate material layer 58A and the second gate material layer 58B may include different work function layers respectively for the needs of transistors of different types, but not limited thereto.

Figure 17:
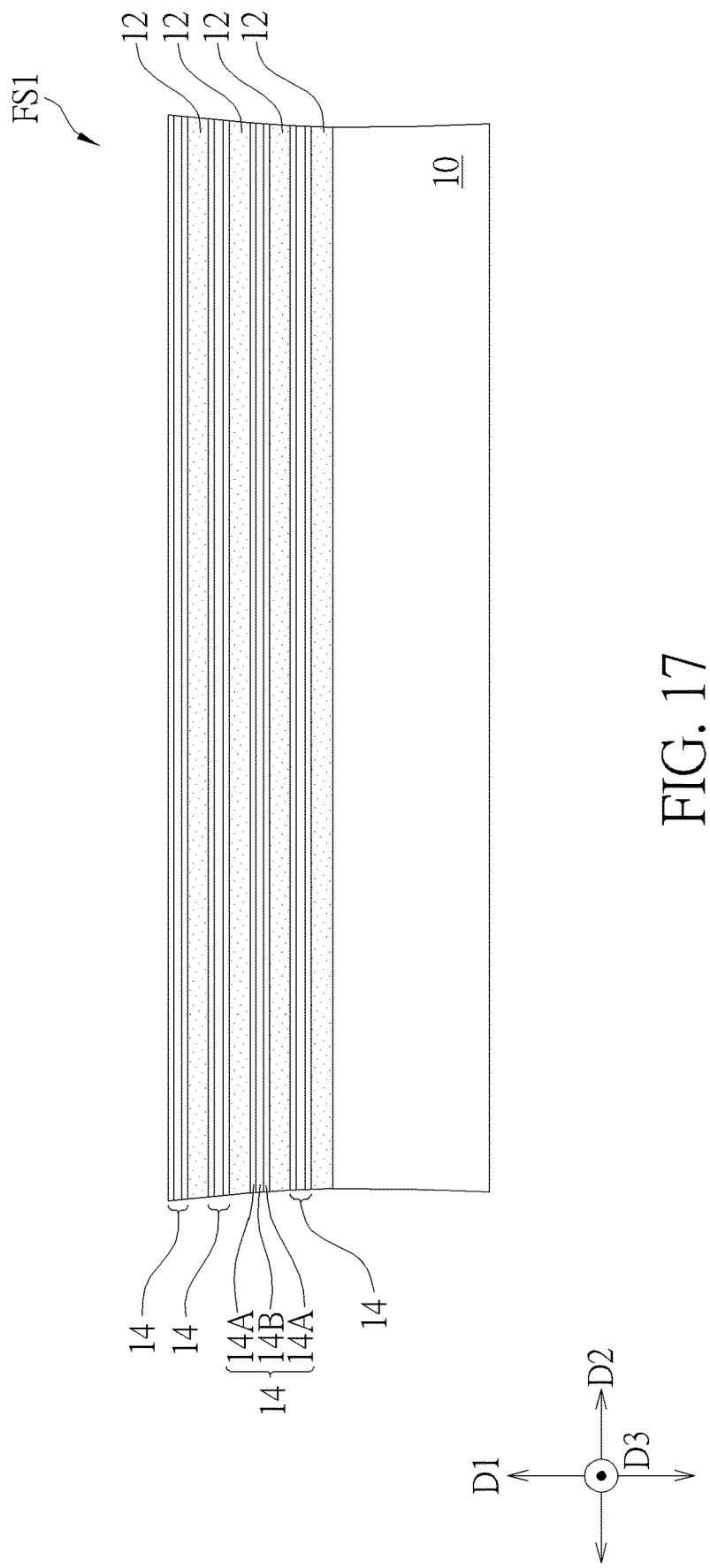
Figure 18:
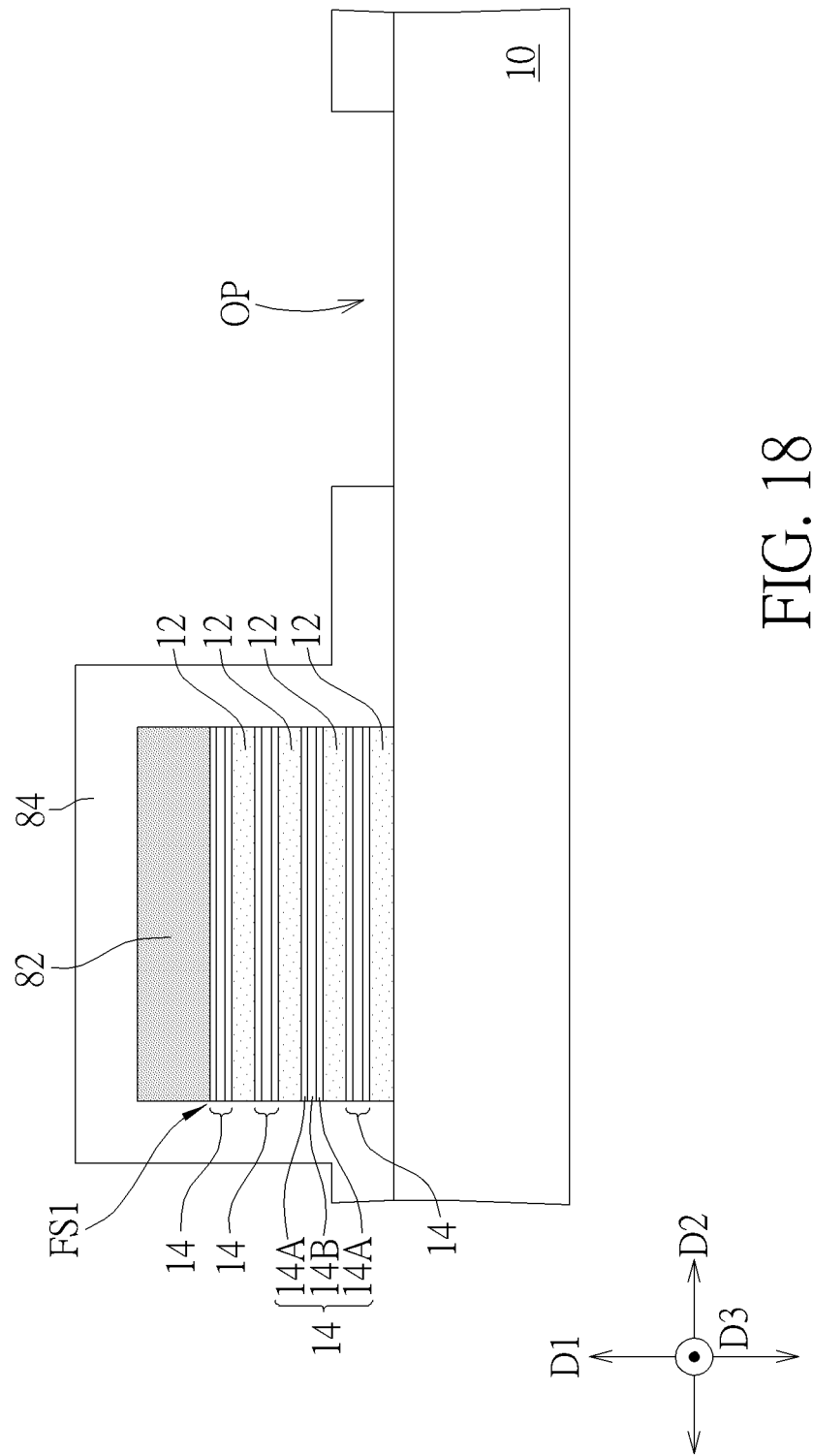
Figure 19:
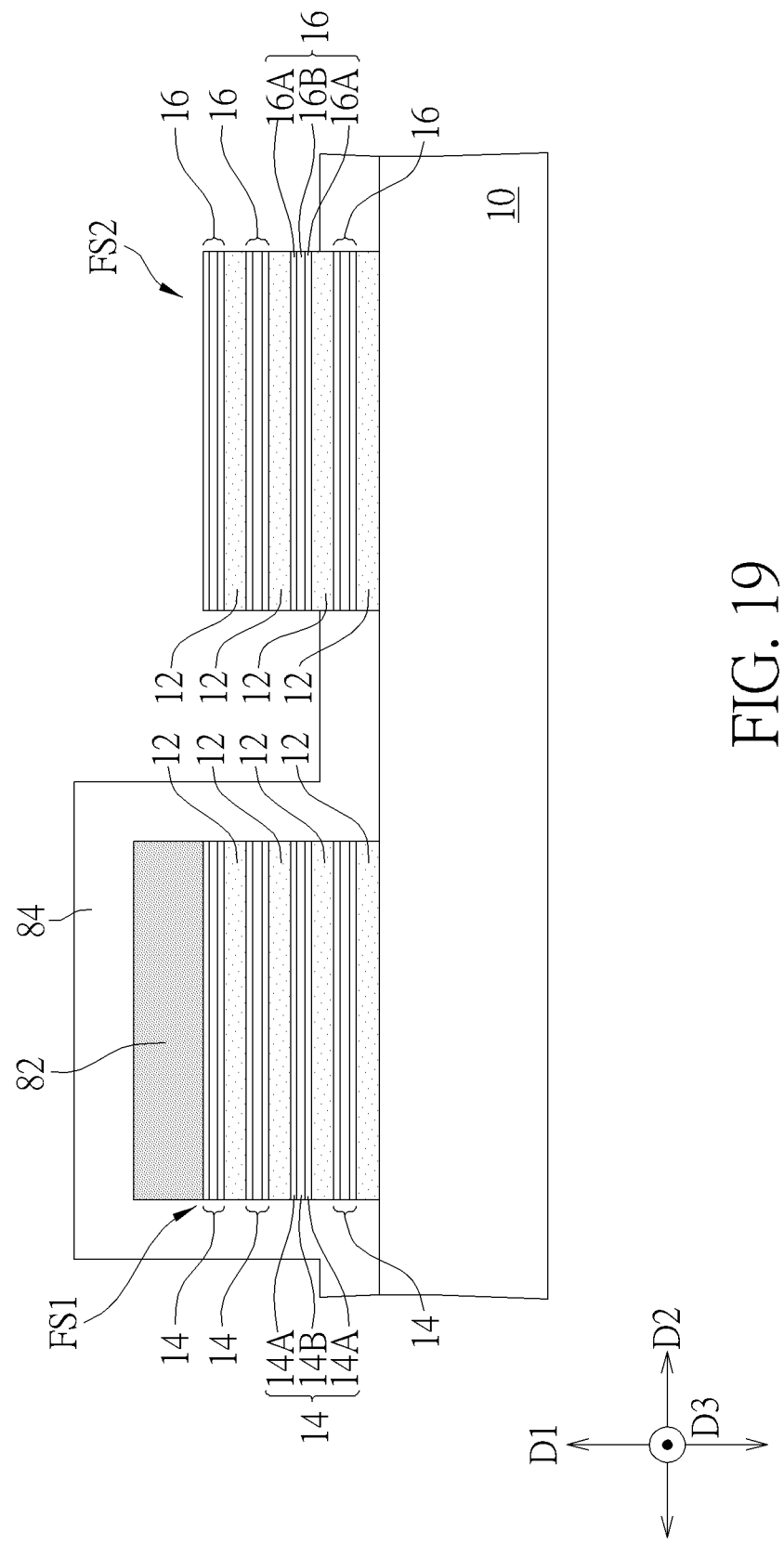
Figure 20:
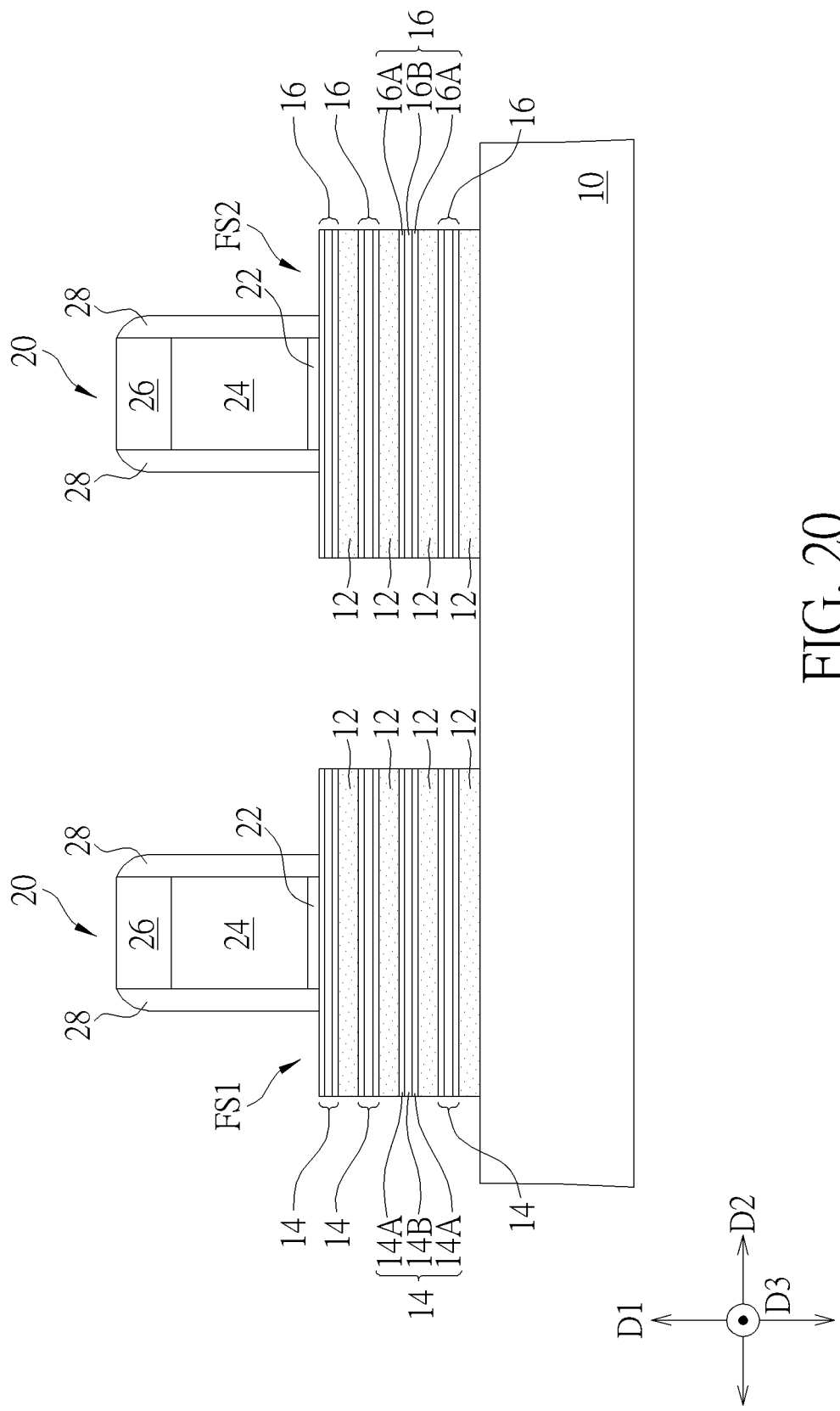
Figure 21:
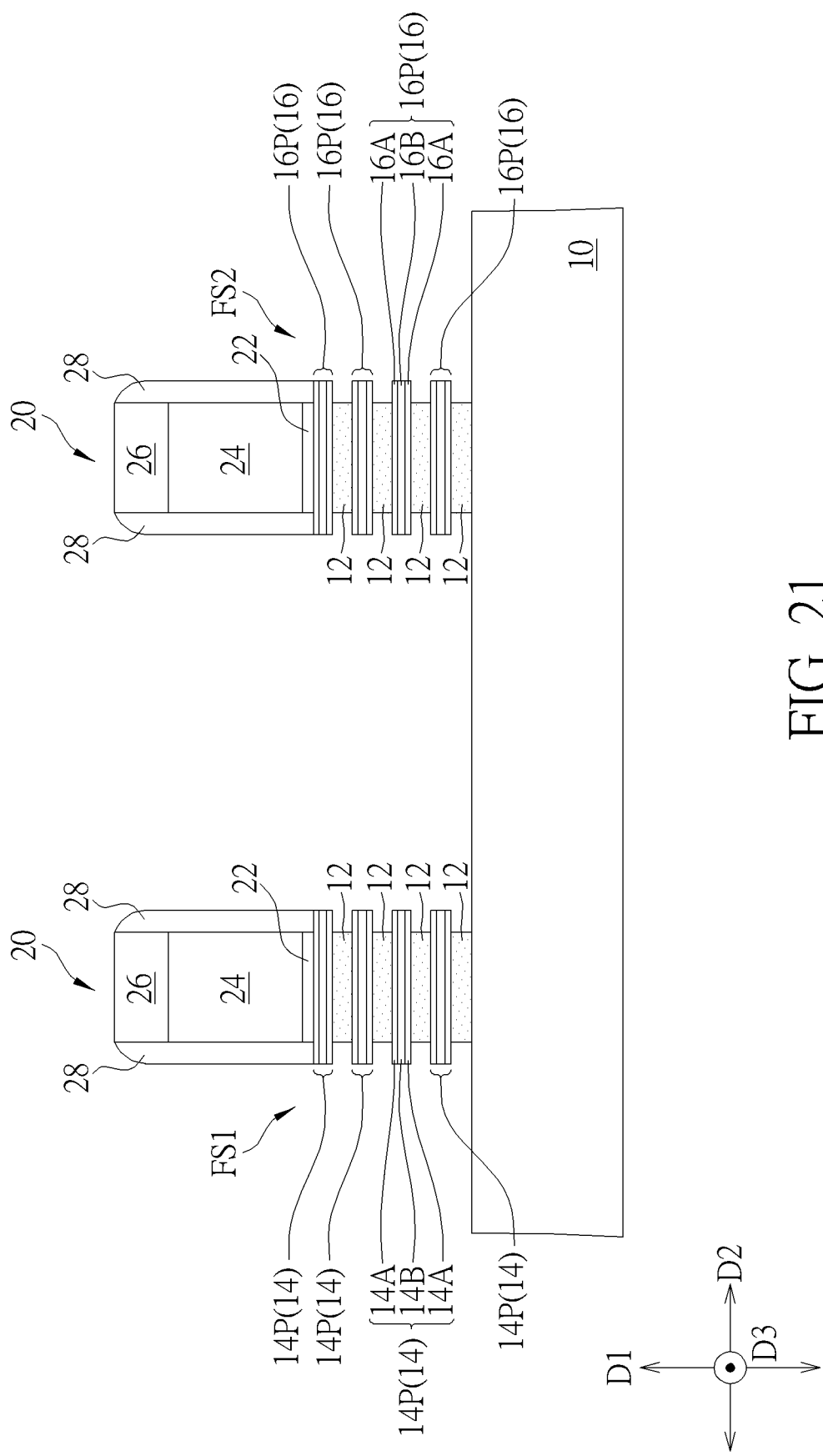
Figure 22:
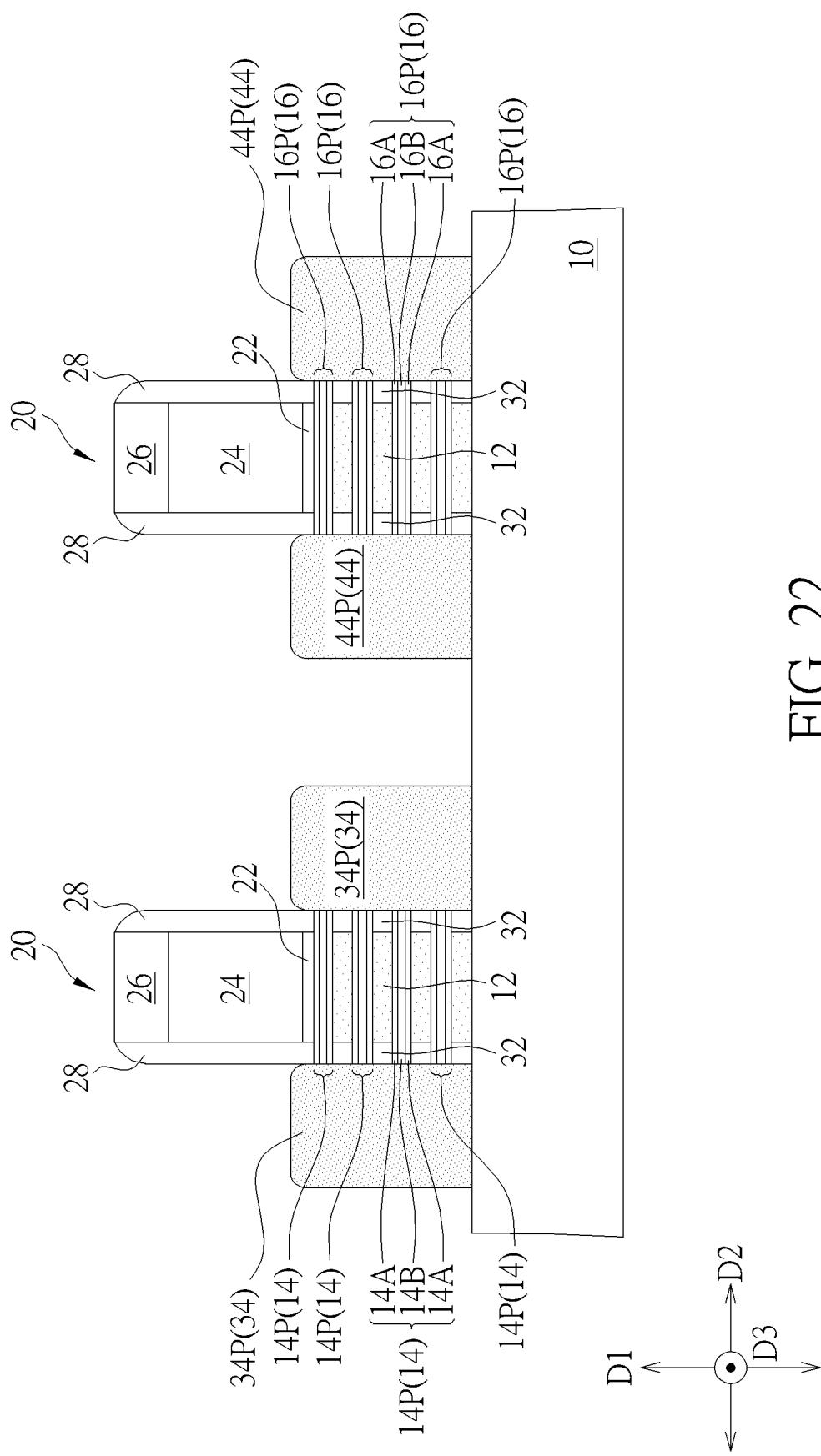

Please refer to FIGS. 16-22. FIGS. 17-22 are schematic drawings illustrating a manufacturing method of the semiconductor device 102 according to the second embodiment of the present invention, wherein FIG. 18 is a schematic drawing in a step subsequent to FIG. 17, FIG. 19 is a schematic drawing in a step subsequent to FIG. 18, FIG. 20 is a schematic drawing in a step subsequent to FIG. 19, FIG. 21 is a schematic drawing in a step subsequent to FIG. 20, FIG. 22 is a schematic drawing in a step subsequent to FIG. 21, and FIG. 16 may be regarded as a schematic drawing in a step subsequent to FIG. 22. The manufacturing method of the semiconductor device 102 in this embodiment may include but is not limited to the following steps. Firstly, as shown in FIG. 17, a first stacked structure FS1 is formed on the substrate 10, and the first stacked structure FS1 may include a plurality of first semiconductor stacked structures 14 and the sacrificial material 12. Each of the first semiconductor stacked structures 14 may include two first doped layers 14A and one second doped layer 14B sandwiched between the two first doped layers 14A in the first direction D1. The first semiconductor stacked structures 14 may be stacked in the first direction D1, and the sacrificial material 12 may be partly disposed between the first semiconductor stacked structures 14 and partly disposed between the first semiconductor stacked structures 14 and the substrate 10. In some embodiments, the first stacked structure FS1 may be regarded as a fin-shaped structure extending in a horizontal direction (such as the second direction D2), but not limited thereto.

As shown in FIG. 17 and FIG. 18, a first patterned mask layer 82 may be formed on the first stacked structure FS1, and an etching process may be performed to the first stacked structure FS1 with the first patterned mask layer 82 as a mask for removing the first stacked structure FS1 without being covered by the first patterned mask layer 82. After the step of removing a part of the first stacked structure FS1, a second patterned mask layer 84 may be formed covering the first stacked structure FS1, the first patterned mask layer 82, and the substrate 10. In addition, the second patterned mask layer 84 may have an opening OP exposing a part of the substrate 10. Subsequently, as shown in FIG. 18 and FIG. 19, a second stacked structure FS2 may be formed from the substrate 10 exposed by the opening OP, and the second stacked structure FS2 may include a plurality of the second semiconductor stacked structures 16 and the sacrificial material 12. Each of the second semiconductor stacked structures 16 may include two third doped layers 16A and one fourth doped layer 16B sandwiched between the two third doped layers 16A in the first direction D1. The second semiconductor stacked structures 16 may be stacked in the first direction D1, and the sacrificial material 12 may be partly disposed between the second semiconductor stacked structures 16 and partly disposed between the second semiconductor stacked structures 16 and the substrate 10. In some embodiments, the second stacked structure FS2 may be further patterned to be a fin-shaped structure extending in a horizontal direction (such as the second direction D2), but not limited thereto.

As shown in FIG. 19 and FIG. 20, the first patterned mask layer 82 and the second patterned mask layer 84 may be removed, and the dummy gate structures 20 and the spacers 28 may be formed on the first stacked structure FS1 and the second stacked structure FS2 respectively. Subsequently, as shown in FIG. 20 and FIG. 21, a patterning process may be performed to the first stacked structure FS1 and the second stacked structure FS2 with the dummy gate structures 20 and the spacers 28 as a mask for forming the first semiconductor sheets 14P and the second semiconductor sheets 16P respectively. In addition, a recessing process may be performed to the sacrificial material 12 for reducing the length of the sacrificial material 12 in the second direction D2 and further exposing a part of each of the first semiconductor sheets 14P and a part of each of the second semiconductor sheets 16P. Subsequently, as shown in FIG. 21 and FIG. 22, the spacer 32 may then be formed on the sidewalls of the sacrificial material 12, and the first source/drain structures 34P and the second source/drain structures 44P may be formed after the step of forming the spacer 32. In some embodiments, the first source/drain structures 34P and the second source/drain structures 44P may be formed by different manufacturing processes (such as epitaxial growth processes), respectively, but not limited thereto.

Subsequently, as shown in FIG. 22 and FIG. 16, the etching stop layer 52 and the dielectric layer 54 may be formed, the first gate structure GS1 may be formed by replacing the dummy gate structure 20 and the sacrificial material 12 corresponding to the first semiconductor sheets 14P with the gate dielectric layer 56 and the first gate material layer 58A, and the second gate structure GS2 may be formed by replacing the dummy gate structure 20 and the sacrificial material 12 corresponding to the second semiconductor sheets 16P with the gate dielectric layer 56 and the second gate material layer 58B. In other words, the first gate structure GS1 and the second gate structure GS2 may be formed by replacement gate processes respectively, and the manufacturing method may be similar to the method of forming the gate structure in the first embodiment described above, but not limited thereto.

It is worth noting that, in this invention, the manufacturing method of the first transistor T1 and the second transistor T2 disposed adjacent to each other in the horizontal direction and separated from each other is not limited to the steps in FIGS. 16-22 described above, and the first transistor T1 and the second transistor T2 may be formed by other suitable methods according to some design considerations. For instance, in some embodiments, a stacked structure composed of the first semiconductor stacked structures 14 and the second semiconductor stacked structures 16 alternately stacked in the first direction D1 may be formed on the substrate 10. After a patterning process performed to this stacked structure with the dummy gate structures 20 and the spacers 28 as a mask, replacement gate processes for the area corresponding to the first transistor T1 and the area corresponding to the second transistor T2 may be carried out respectively for removing the second semiconductor sheets 16P in the area corresponding to the first transistor T1 and the first semiconductor sheets 14P in the area corresponding to the second transistor T2 so as to form the first transistor T1 including the first semiconductor sheets 14P and the second transistor T2 including the second semiconductor sheets 16P. In addition, in the semiconductor device formed by the manufacturing method described above, the locations of the first semiconductor sheets 14P in the first direction D1 may be misaligned with the locations of the second semiconductor sheets 16P in the first direction D1, but not limited thereto.

To summarize the above descriptions, in the semiconductor device and the manufacturing method thereof in the present invention, each of the semiconductor sheets may be formed with two doped layers having the same conductivity type and another doped layer sandwiched between the two doped layers and having the conductivity type different from that of the two doped layers. The depletion state in the channel region and/or the distribution of the electrical field during the operation of the transistor including the semiconductor sheets may be modified, and the electrical performance of the semiconductor device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   forming a transistor on a substrate, wherein the transistor comprises:
   semiconductor sheets stacked in a vertical direction and separated from one another, wherein each of the semiconductor sheets comprises:
   two first doped layers; and
   a second doped layer disposed between the two first doped layers in the vertical direction, wherein a conductivity type of the second doped layer is complementary to a conductivity type of each of the two first doped layers; and
   two source/drain structures disposed at two opposite sides of each of the semiconductor sheets in a horizontal direction respectively, wherein the two source/drain structures are connected with the semiconductor sheets.

2. The manufacturing method of the semiconductor device according to claim 1, wherein a conductivity type of each of the two source/drain structures is identical to the conductivity type of each of the first doped layers.

3. The manufacturing method of the semiconductor device according to claim 2, wherein an impurity concentration of each of the two source/drain structures is equal to an impurity concentration of each of the first doped layers with a tolerance of ±10%.

4. The manufacturing method of the semiconductor device according to claim 1, wherein each of the two source/drain structures is directly connected with the two first doped layers and the second doped layer of each of the semiconductor sheets.

5. The manufacturing method of the semiconductor device according to claim 1, wherein each of the second doped layers is directly connected with the two first doped layers in the same semiconductor sheet.

6. The manufacturing method of the semiconductor device according to claim 1, wherein a method of forming the semiconductor sheets comprises:
   forming a stacked structure on the substrate, wherein the stacked structure comprises:
   semiconductor staked structures, wherein each of the semiconductor staked structures comprises the two first doped layers and the second doped layer disposed between the two first doped layers in the vertical direction; and
   a sacrificial material, wherein the semiconductor staked structures and the sacrificial material are alternately stacked in the vertical direction;
   forming a dummy gate structure on the stacked structure; and
   performing a patterning process to the stacked structure, wherein each of the semiconductor staked structures is patterned to be the semiconductor sheet by the patterning process.

7. The manufacturing method of the semiconductor device according to claim 6, wherein the transistor further comprises a gate structure encompassing each of the semiconductor sheets, and the two source/drain structures are disposed at two opposite sides of the gate structure in the horizontal direction respectively.

8. The manufacturing method of the semiconductor device according to claim 7, wherein the gate structure is formed by replacing the dummy gate structure and the sacrificial material with a gate dielectric layer and a gate material layer.

9. The manufacturing method of the semiconductor device according to claim 8, wherein the two source/drain structures are formed by an epitaxial process performed after the patterning process and before the gate structure is formed.

10. A manufacturing method of a semiconductor device, comprising:
    forming a first transistor on a substrate, wherein the first transistor comprises:
    first semiconductor sheets stacked in a vertical direction and separated from one another, wherein each of the first semiconductor sheets comprises:
    two first doped layers; and
    a second doped layer disposed between the two first doped layers in the vertical direction, wherein a conductivity type of the second doped layer is complementary to a conductivity type of each of the two first doped layers; and
    two first source/drain structures disposed at two opposite sides of each of the first semiconductor sheets in a horizontal direction respectively, wherein the first source/drain structures are connected with the first semiconductor sheets; and
    forming a second transistor on the substrate, wherein the second transistor comprises:

second semiconductor sheets stacked in the vertical direction and separated from one another, wherein each of the second semiconductor sheets comprises:
two third doped layers; and
a fourth doped layer disposed between the two third doped layers in the vertical direction, wherein a conductivity type of the fourth doped layer is complementary to a conductivity type of each of the two third doped layers, and the conductivity type of each of the two third doped layers is identical to the conductivity type of each of the first doped layers; and
two second source/drain structures disposed at two opposite sides of each of the second semiconductor sheets in the horizontal direction respectively, wherein the second source/drain structures are connected with the second semiconductor sheets.

11. The manufacturing method of the semiconductor device according to claim 10, wherein a conductivity type of each of the two first source/drain structures is identical to the conductivity type of each of the first doped layers, and a conductivity type of each of the two second source/drain structures is identical to the conductivity type of each of the third doped layers.

12. The manufacturing method of the semiconductor device according to claim 11, wherein an impurity concentration of each of the two first source/drain structures is equal to an impurity concentration of each of the first doped layers with a tolerance of ±10%, and an impurity concentration of each of the two second source/drain structures is equal to an impurity concentration of each of the third doped layers with a tolerance of ±10%.

13. The manufacturing method of the semiconductor device according to claim 10, wherein each of the two first source/drain structures is directly connected with the two first doped layers and the second doped layer of each of the first semiconductor sheets, and each of the two second source/drain structures is directly connected with the two third doped layers and the fourth doped layer of each of the second semiconductor sheets.

14. The manufacturing method of the semiconductor device according to claim 10, wherein each of the second doped layers is directly connected with the two first doped layers in the same first semiconductor sheet, and each of the fourth doped layers is directly connected with the two third doped layers in the same second semiconductor sheet.

15. The manufacturing method of the semiconductor device according to claim 10, wherein the first semiconductor sheets are disposed between the substrate and the second semiconductor sheets in the vertical direction.

16. The manufacturing method of the semiconductor device according to claim 15, wherein a method of forming the first semiconductor sheets and the second semiconductor sheets comprises:
forming a stacked structure on the substrate, wherein the stacked structure comprises:
first semiconductor staked structures, wherein each of the first semiconductor staked structures comprises the two first doped layers and the second doped layer disposed between the two first doped layers in the vertical direction;
second semiconductor staked structures disposed above the first semiconductor staked structures, wherein each of the second semiconductor staked structures comprises the two third doped layers and the fourth doped layer disposed between the two third doped layers in the vertical direction; and
a sacrificial material, wherein the sacrificial material and the first semiconductor stacked structures are alternately stacked in a lower portion of the stacked structure, and the sacrificial material and the second semiconductor stacked structures are alternately stacked in an upper portion of the stacked structure;
forming a dummy gate structure on the stacked structure; and
performing a patterning process to the stacked structure, wherein each of the first semiconductor staked structures is patterned to be the first semiconductor sheet by the patterning process, and each of the second semiconductor staked structures is patterned to be the second semiconductor sheet by the patterning process.

17. The manufacturing method of the semiconductor device according to claim 16, wherein the first transistor further comprises a first portion of a gate structure, the second transistor further comprises a second portion of the gate structure, the first portion of the gate structure encompasses each of the first semiconductor sheets, and the second portion of the gate structure encompasses each of the second semiconductor sheets, wherein the first portion of the gate structure is directly connected with the second portion of the gate structure, and the first portion of the gate structure is disposed between the second portion of the gate structure and the substrate in the vertical direction.

18. The manufacturing method of the semiconductor device according to claim 17, wherein the gate structure is formed by replacing the dummy gate structure and the sacrificial material with a gate dielectric layer and a gate material layer.

19. The manufacturing method of the semiconductor device according to claim 18, wherein at least a portion of each of the first source/drain structures is disposed between the substrate and one of the two second source/drain structures in the vertical direction, and the first source/drain structures and the second source/drain structures are formed after the patterning process and before the gate structure is formed.

20. The manufacturing method of the semiconductor device according to claim 10, wherein the first transistor and the second transistor are formed on the same plane.

* * * * *